US008253252B2

(12) United States Patent
Shingu et al.

(10) Patent No.: US 8,253,252 B2
(45) Date of Patent: Aug. 28, 2012

(54) SEMICONDUCTOR DEVICE AND MANUFACTURING METHOD THEREOF

(75) Inventors: Takashi Shingu, Kanagawa (JP); Hideki Matsukura, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 426 days.

(21) Appl. No.: 12/051,645

(22) Filed: Mar. 19, 2008

(65) Prior Publication Data

US 2008/0230835 A1    Sep. 25, 2008

(30) Foreign Application Priority Data

Mar. 23, 2007 (JP) ................................ 2007-077624

(51) Int. Cl.
    H01L 23/48 (2006.01)
(52) U.S. Cl. ................ 257/773; 257/347; 257/E29.295
(58) Field of Classification Search .................. 257/347, 257/348, 773, E29.295
    See application file for complete search history.

(56) References Cited

U.S. PATENT DOCUMENTS

| 4,890,141 | A | 12/1989 | Tang et al. | |
|---|---|---|---|---|
| 5,121,186 | A | 6/1992 | Wong et al. | |
| 5,338,702 | A | 8/1994 | Kobeda et al. | |
| 5,341,028 | A * | 8/1994 | Yamaguchi et al. | 257/344 |
| 5,583,366 | A | 12/1996 | Nakazawa | |
| 5,652,453 | A | 7/1997 | Iwamatsu et al. | |
| 5,656,825 | A | 8/1997 | Kusumoto et al. | |
| 5,940,690 | A | 8/1999 | Kusumoto et al. | |
| 5,962,897 | A * | 10/1999 | Takemura et al. | 257/347 |
| 6,030,873 | A | 2/2000 | Iwamatsu et al. | |
| 6,160,272 | A | 12/2000 | Arai et al. | |
| 6,278,131 | B1 | 8/2001 | Yamazaki et al. | |
| 6,316,787 | B1 | 11/2001 | Ohtani | |
| 6,337,232 | B1 | 1/2002 | Kusumoto et al. | |
| 6,455,875 | B2 * | 9/2002 | Takemura et al. | 257/72 |
| 6,472,684 | B1 | 10/2002 | Yamazaki et al. | |
| 6,541,795 | B2 | 4/2003 | Kusumoto et al. | |
| 6,593,592 | B1 | 7/2003 | Yamazaki et al. | |
| 6,709,901 | B1 | 3/2004 | Yamazaki et al. | |
| 6,882,018 | B2 | 4/2005 | Ohtani et al. | |
| 6,933,569 | B2 * | 8/2005 | Koh et al. | 257/347 |
| 7,122,830 | B2 | 10/2006 | Ishikawa et al. | |
| 7,211,502 | B2 | 5/2007 | Yamazaki et al. | |
| 7,223,666 | B2 | 5/2007 | Ohtani et al. | |
| 7,410,839 | B2 * | 8/2008 | Isobe et al. | 438/149 |
| 7,602,020 | B2 * | 10/2009 | Takemura et al. | 257/347 |
| 7,696,024 | B2 * | 4/2010 | Maruyama et al. | 438/151 |
| 7,723,788 | B2 * | 5/2010 | Takemura et al. | 257/347 |

(Continued)

FOREIGN PATENT DOCUMENTS

JP    61-048975    3/1986

(Continued)

*Primary Examiner* — Allan R Wilson

(74) *Attorney, Agent, or Firm* — Nixon Peabody LLP; Jeffrey L. Costellia

(57) ABSTRACT

It is an object to provide an element structure of a semiconductor device for having a sufficient contact area between an electrode in contact with a source region or a drain region and the source region or the drain region, and a method for manufacturing the semiconductor device with the element structure. An upper electrode is formed over a high-concentration impurity region (the source region or the drain region). A contact hole passing through an interlayer insulating film is formed overlapping with a region where the upper electrode and the high-concentration impurity region are stacked.

11 Claims, 18 Drawing Sheets

U.S. PATENT DOCUMENTS

| | | | |
|---|---|---|---|
| 7,791,172 B2 * | 9/2010 | Akimoto | 257/612 |
| 2002/0113268 A1 | 8/2002 | Koyama et al. | |
| 2005/0017303 A1 * | 1/2005 | Ishikawa | 257/347 |
| 2006/0068536 A1 | 3/2006 | Yamazaki | |
| 2006/0203533 A1 | 9/2006 | Kato et al. | |
| 2007/0126058 A1 | 6/2007 | Godo et al. | |
| 2007/0190740 A1 * | 8/2007 | Furukawa et al. | 438/423 |
| 2007/0210451 A1 | 9/2007 | Ohtani et al. | |
| 2007/0252210 A1 * | 11/2007 | Ishikawa | 257/347 |
| 2008/0093464 A1 | 4/2008 | Dairiki et al. | |
| 2008/0203501 A1 | 8/2008 | Yamazaki et al. | |
| 2008/0224215 A1 * | 9/2008 | Yamazaki et al. | 257/347 |
| 2009/0152631 A1 * | 6/2009 | Takemura et al. | 257/347 |

FOREIGN PATENT DOCUMENTS

| | | |
|---|---|---|
| JP | 02-076264 | 3/1990 |
| JP | 05-013762 | 1/1993 |
| JP | 09-027624 | 1/1997 |
| JP | 2003-289079 | 10/2003 |

* cited by examiner

2180

2180

2180

2180

2180

2180

2180

2180

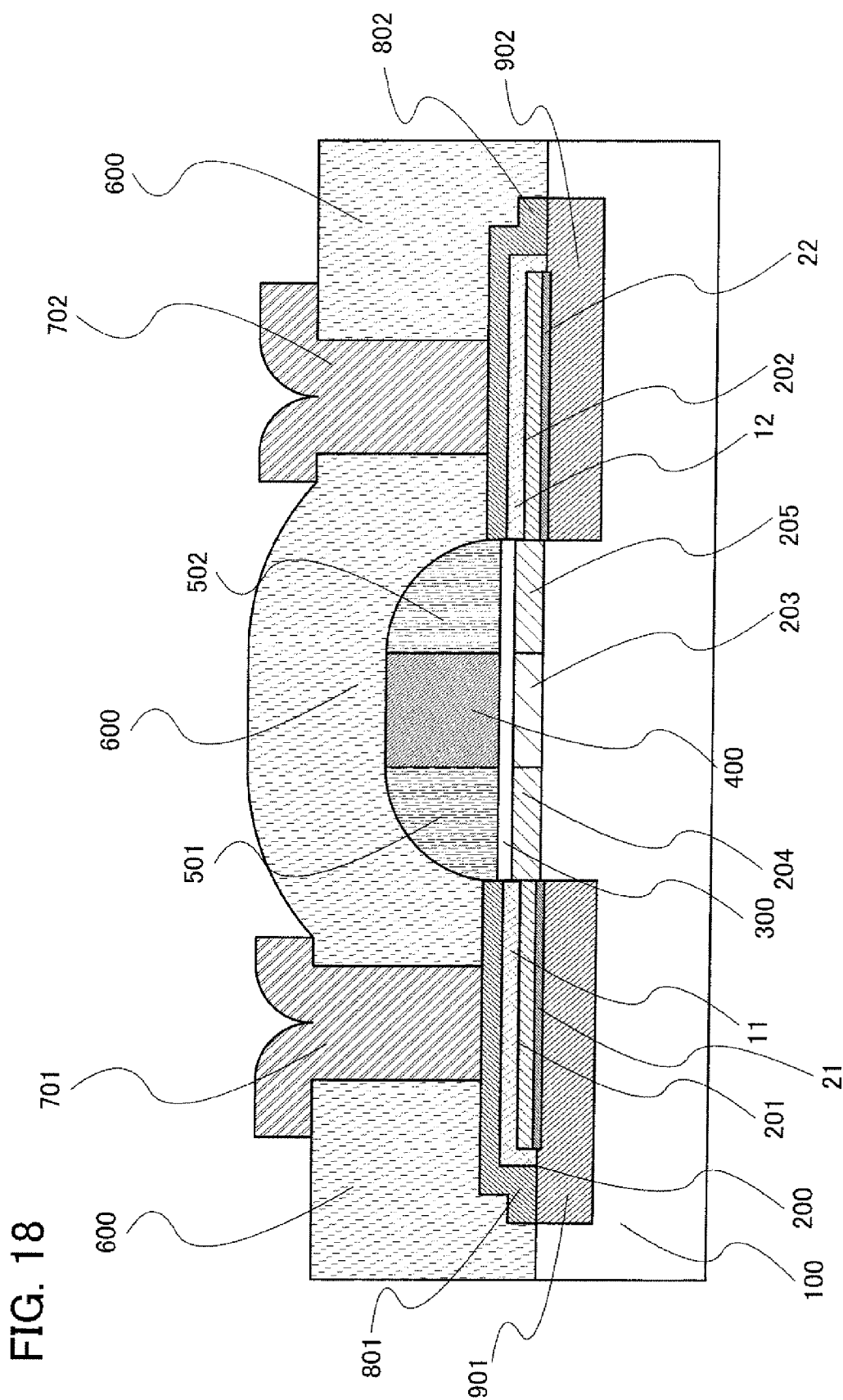

SEMICONDUCTOR DEVICE AND MANUFACTURING METHOD THEREOF

BACKGROUND OF THE INVENTION

1. Field of the Invention

The present invention relates to a semiconductor device including a transistor.

2. Description of the Related Art

A thin film transistor (TFT) is formed using a thin semiconductor layer.

As a method for achieving high performance of a semiconductor device, there is a method which achieves high definition in a semiconductor device. A smaller contact hole is necessary in order to achieve high definition in a semiconductor device.

In order to achieve high performance in a semiconductor device, there is another method in which a channel formation region of a semiconductor layer included in a semiconductor device is thinned.

There is a technology in which increase in field-effect mobility, improvement in a field-effect subthreshold property, and reduction in leak current can be achieved by thinning a channel formation region of a semiconductor layer.

A channel formation region, a source region, and a drain region of a thin film transistor are formed using the identical semiconductor film in many cases.

In such a case, when the channel formation region of the thin film transistor is thinned, the source and drain regions are also thinned unintentionally.

Consequently, in forming contact holes, a problem is more likely to arise that the semiconductor layer is removed entirely by overetching.

In view of the above problem, Reference 1 (Japanese Published Patent Application No. H5-13762) discloses an etching method for achieving both a smaller contact hole and prevention of overetching.

SUMMARY OF THE INVENTION

When a contact hole is made to have a smaller size, an electrode (wiring) in contact with a source or drain region inevitably has a smaller contact area with the source or drain region.

A smaller contact area leads to higher contact resistance between the electrode and the source or drain region. Higher contact resistance increases power consumption of a TFT. Too high contact resistance can result in inoperativeness of the TFT.

When the etching method disclosed in Reference 1 is used in order to achieve both a smaller contact hole and prevention of overetching, a process in forming the contact hole is complicated (in Reference 1, etching is performed plural times).

In view of the above problem, an object of the present invention is to provide: an element structure of a semiconductor device for obtaining a sufficient contact area between an electrode in contact with a source or drain region and the source or drain region, and for preventing overetching; and a method for manufacturing the semiconductor device with the element structure.

A feature of a semiconductor device of the present invention is that an upper electrode is formed on an impurity region (a source or drain region).

Another feature of the semiconductor device of the present invention is that: an interlayer insulating film is formed over a semiconductor layer, a gate insulating film, and a gate electrode; a contact hole passes through the interlayer insulating film; and the contact hole overlaps with a region where the upper electrode and the impurity region are stacked.

Another feature of the semiconductor device of the present invention is that the upper electrode has a larger area than that of the contact hole.

In the semiconductor device of the present invention, it is preferable that the lower surface of the upper electrode be in contact with the entire upper surface of the impurity region.

Another feature is that the semiconductor device of the present invention includes a wiring connected electrically to the upper electrode through the contact hole.

In the semiconductor device of the present invention, it is preferable that the upper electrode be a barrier metal. A conductive layer (of, e.g., titanium (Ti), molybdenum (Mo), tungsten (W), tantalum (Ta), or tantalum nitride (hereinafter, referred to as "TaN"; however, the composition ratio of Ta to N is not limited to 1:1)) with a higher melting point than that of the wiring can be applied to the barrier metal.

Another feature of the semiconductor device of the present invention is that a lower electrode is formed under a source or drain region, and the lower electrode is in contact with the upper electrode. That is to say, the source or drain region is sandwiched between the upper electrode and the lower electrode to form a sandwich structure.

Another feature of the semiconductor device of the present invention is that an insulator with an opening (an aperture shape) is provided under the semiconductor layer, and the lower electrode is formed in the opening.

Another feature of the semiconductor device of the present invention is that a surface (upper surface) of the insulator and a surface (upper surface) of the lower electrode form the same plane surface.

Another feature of the semiconductor device of the present invention is that a silicide layer formed with a material of the upper electrode and a material of the impurity region is formed between the upper electrode and the impurity region.

Another feature of the semiconductor device of the present invention is that a silicide layer is formed between the lower electrode and the impurity region.

Another feature is that the silicide layer is formed of a silicide material formed with a material of the lower electrode and the material of the impurity region.

When the silicide layer is formed, titanium (Ti), nickel (Ni), cobalt (Co), tungsten (W), molybdenum (Mo), or the like can be applied to the material of the electrode.

According to another feature of the semiconductor device of the present invention, a semiconductor layer including a channel formation region and an impurity region is formed; a gate electrode is formed over the channel formation region with a gate insulating film interposed therebetween; an upper electrode is formed to cover the impurity region; an interlayer insulating film that covers the semiconductor layer, the gate insulating film, the gate electrode, and the upper electrode is formed; a contact hole is formed through the interlayer insulating film; a wiring is formed over the interlayer insulating film; the contact hole overlaps with a region where the impurity region and the upper electrode are stacked; and the wiring is in contact with the upper electrode in the contact hole.

According to another feature of the semiconductor device of the present invention, a semiconductor layer including a channel formation region and an impurity region is formed; a gate electrode is formed over the channel formation region with a gate insulating film interposed therebetween; an upper electrode is formed to cover the impurity region; a lower electrode is formed under the impurity region; an interlayer insulating film that covers the semiconductor layer, the gate insulating film, the gate electrode, and the upper electrode is formed; a contact hole is formed through the interlayer insulating film; a wiring is formed over the interlayer insulating film; the contact hole overlaps with a region where the impurity region and the upper electrode are stacked; the wiring is in contact with the upper electrode in the contact hole; and the upper electrode and the lower electrode are in contact with each other in a position where the upper electrode and the lower electrode do not overlap with the semiconductor layer.

According to another feature of the semiconductor device of the present invention, a semiconductor layer including a channel formation region and an impurity region is formed; an insulator having an opening is formed; a lower electrode is formed in the opening; the channel formation region is formed over the insulator; the impurity region is formed over the lower electrode; a gate electrode is formed over the channel formation region with a gate insulating film interposed therebetween; an upper electrode is formed to cover the impurity region; an interlayer insulating film that covers the semiconductor layer, the gate insulating film, the gate electrode, and the upper electrode is formed; a contact hole is formed through the interlayer insulating film; a wiring is formed over the interlayer insulating film; the contact hole overlaps with a region where the impurity region and the upper electrode are stacked; the wiring is in contact with the upper electrode in the contact hole; and the upper electrode and the lower electrode are in contact with each other in a position where the upper electrode and the lower electrode do not overlap with the semiconductor layer.

Another feature of the semiconductor device of the present invention is that a silicide layer formed with a material of the lower electrode and a material of the impurity region is formed between the lower electrode and the impurity region.

Another feature of the semiconductor device of the present invention is that a silicide layer formed with a material of the upper electrode and a material of the impurity region is formed between the upper electrode and the impurity region.

Another feature of the semiconductor device of the present invention is that the lower electrode is formed of a barrier metal.

Another feature of the semiconductor device of the present invention is that the upper electrode is formed of a barrier metal.

Another feature of the semiconductor device of the present invention is that the barrier metal is titanium, molybdenum, tungsten, tantalum, or tantalum nitride.

According to another feature of the semiconductor device of the present invention, a gate electrode is formed over a semiconductor layer with a gate insulating film interposed therebetween; a silicide layer is formed on the top surface of an impurity region formed in the semiconductor layer; an upper electrode is formed on the top surface of the silicide layer; an interlayer insulating film that covers the semiconductor layer, the gate insulating film, the gate electrode, and the upper electrode is formed; a contact hole is formed through the interlayer insulating film; the silicide layer is formed of a silicide material formed with a material of the semiconductor layer and a material of the upper electrode; and the contact hole overlaps with a region where the impurity region and the upper electrode are stacked.

According to another feature of the semiconductor device of the present invention, a gate electrode is formed over a semiconductor layer with a gate insulating film interposed therebetween; a silicide layer is formed on the top surface of an impurity region formed in the semiconductor layer; an upper electrode is formed on the top surface of the silicide layer; a lower electrode is formed on the bottom surface of the impurity region; an interlayer insulating film that covers the semiconductor layer, the gate insulating film, the gate electrode, the upper electrode and the lower electrode is formed; a contact hole is formed through the interlayer insulating film; the silicide layer is formed of a silicide material formed with a material of the semiconductor layer and a material of the upper electrode; the contact hole overlaps with a region where the impurity region and the upper electrode are stacked; and the upper electrode and the lower electrode are in contact with each other in a position where the upper electrode and the lower electrode do not overlap with the semiconductor layer.

According to another feature of the semiconductor device of the present invention, a gate electrode is formed over a semiconductor layer with a gate insulating film interposed therebetween; an upper electrode is formed on the top surface of an impurity region formed in the semiconductor layer; a silicide layer is formed on the bottom surface of the impurity region; a lower electrode is formed on the bottom surface of the silicide layer; an interlayer insulating film that covers the semiconductor layer, the gate insulating film, the gate electrode, the upper electrode and the lower electrode is formed; a contact hole is formed through the interlayer insulating film; the contact hole overlaps with a region where the impurity region and the upper electrode are stacked; the silicide layer is formed of a silicide material formed with a material of the semiconductor layer and a material of the lower electrode; and the upper electrode and the lower electrode are in contact with each other in a position where the upper electrode and the lower electrode do not overlap with the semiconductor layer.

According to another feature of the semiconductor device of the present invention, a gate electrode is formed over a semiconductor layer with a gate insulating film interposed therebetween; a first silicide layer is formed on the top surface of an impurity region formed in the semiconductor layer; an upper electrode is formed on the top surface of the first silicide layer; a second silicide layer is formed on the bottom surface of the impurity region; a lower electrode is formed on the bottom surface of the second silicide layer; an interlayer insulating film that covers the semiconductor layer, the gate insulating film, the gate electrode, the upper electrode and the lower electrode is formed; a contact hole is formed through the interlayer insulating film; the first silicide layer is formed of a silicide material formed with a material of the semiconductor layer and a material of the upper electrode; the second silicide layer is formed of a silicide material formed with a material of the semiconductor layer and a material of the lower electrode; the contact hole overlaps with a region where the impurity region and the upper electrode are stacked; and the upper electrode and the lower electrode are in contact with each other in a position where the upper electrode and the lower electrode do not overlap with the semiconductor layer.

Another feature of the semiconductor device of the present invention is that the upper electrode is formed of titanium, nickel, cobalt, tungsten, or molybdenum.

Another feature of the semiconductor device of the present invention is that the lower electrode is formed of titanium, nickel, cobalt, tungsten, or molybdenum.

Another feature of the semiconductor device of the present invention is that the upper electrode has a larger area than that of a bottom portion of the contact hole.

Provision of an upper electrode over a source or drain region can increase a contact area between the electrode and the source or drain region, so that contact resistance can be lowered. Further, the upper electrode functions as an etching stopper, and thus can prevent a semiconductor layer from being thinned or removed entirely by overetching.

Furthermore, a sandwich structure in which the source or drain region is sandwiched between the upper electrode and the lower electrode can further increase the contact area, so that contact resistance can be further lowered.

BRIEF DESCRIPTION OF THE DRAWINGS

In the accompanying drawings:

FIG. 18 is a cross-sectional view of a semiconductor device of an embodiment mode of the present invention.

DETAILED DESCRIPTION OF THE INVENTION

Figure 1:
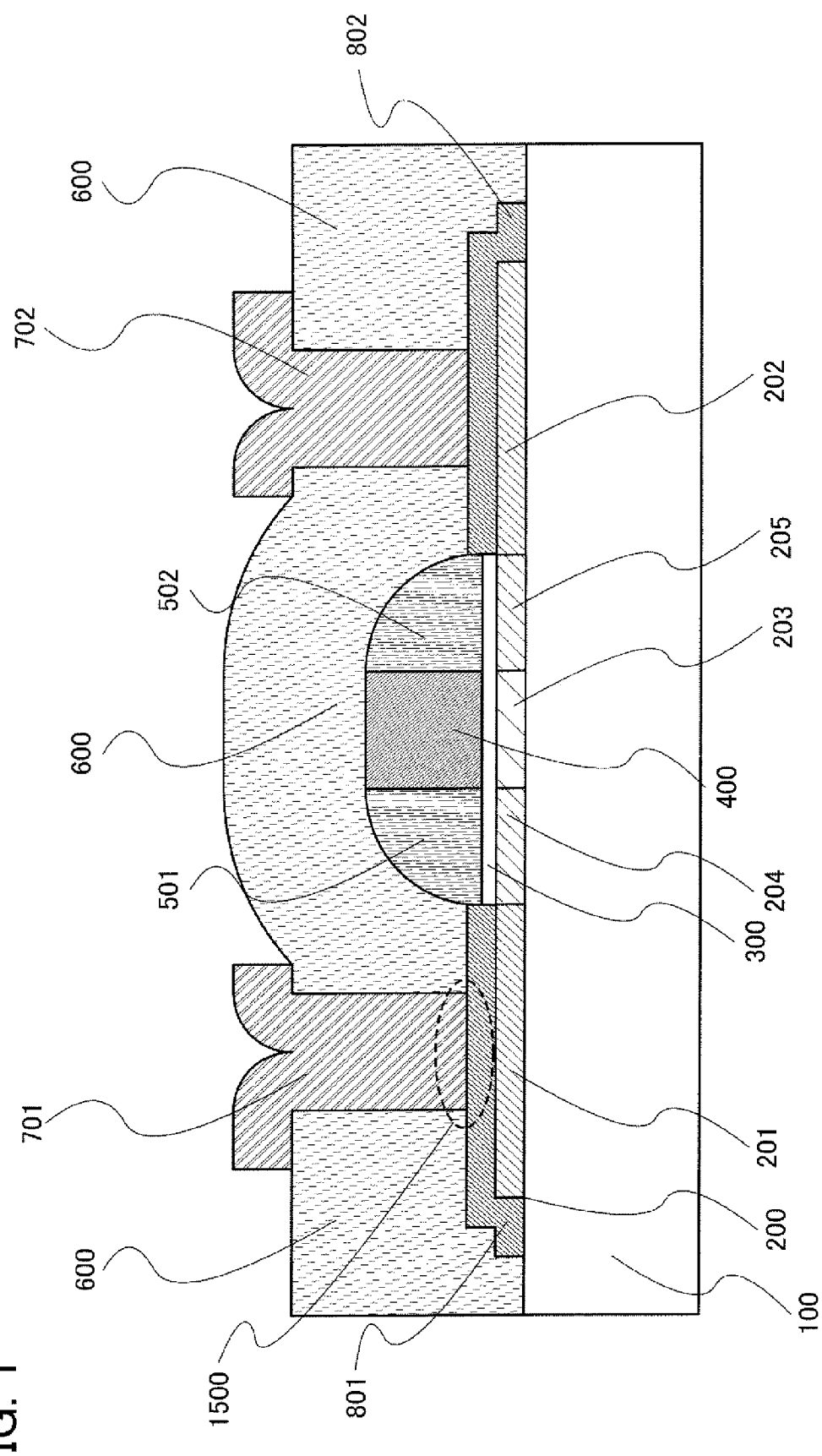
FIG. 1 is a cross-sectional view of a semiconductor device of an embodiment mode of the present invention.

Hereinafter, embodiment modes of the present invention are described with reference to the drawings. Note that the present invention can be performed in many different modes and it is easily understood by those skilled in the art that the modes and details disclosed herein can be modified in various ways without departing from the spirit and the scope of the present invention. Therefore, the present invention should not be interpreted as being limited to the description of the embodiment modes.

The following Embodiment Modes 1 to 5 can be combined appropriately. Parts with the same reference numerals in the drawings can be formed using the same materials and by the same methods unless otherwise noted.

Embodiment Mode 1

A semiconductor device of this embodiment mode is described with reference to FIG. 1.

The semiconductor device of this embodiment mode includes an insulator 100, a semiconductor layer 200 (of an island shape), a gate insulating film 300, a gate electrode 400, a sidewall 501, a sidewall 502, an interlayer insulating film 600, a wiring 701, a wiring 702, an upper electrode 801, and an upper electrode 802 (see FIG. 1).

The insulator 100 is a base insulating film formed over a substrate, or a substrate.

The semiconductor layer 200 is formed over the insulator 100.

The semiconductor layer 200 includes a channel formation region 203 placed between a source region 201 and a drain region 202.

The source region 201 and the drain region 202 are high-concentration impurity regions that are formed by adding an impurity element imparting conductivity to parts of the semiconductor layer 200 at a high concentration. In this embodiment mode, phosphorus, which is an element imparting n-type conductivity, is added as the impurity element so that the high-concentration impurity regions contain phosphorus at a peak concentration of $1\times10^{19}$ to $1\times10^{21}$ cm$^{-3}$ (an element imparting p-type conductivity, e.g., boron, may also be added instead of the element imparting n-type conductivity).

In FIG. 1, an LDD region 204 and an LDD region 205 are placed between the source region 201 and the drain region 202. The channel formation region 203 is placed between the LDD region 204 and the LDD region 205.

The LDD regions 204 and 205 are low-concentration impurity regions that are formed by adding an impurity element imparting conductivity to parts of the semiconductor layer 200 at a low concentration. In this embodiment mode, phosphorus, which is an element imparting n-type conductivity, is added as the impurity element so that the low-concentration impurity regions contain phosphorus at a peak concentration of $1\times10^{16}$ to $1\times10^{18}$ cm$^{-3}$.

The LDD regions 204 and 205 are not necessarily provided. Further, only either the LDD region 204 or 205 may be provided.

When neither the LDD region 204 nor 205 is present, the channel formation region 203 is provided between the source region 201 and the drain region 202.

When only either the LDD region 204 or 205 is present, the channel formation region 203 and the LDD region are provided between the source region 201 and the drain region 202.

When the channel length (the length of a channel formation region in a direction of carrier flow) is small, a defect called "a short channel effect" occurs. A structure in which an LDD region is provided is preferable for suppressing the short channel effect. Further, an LDD region has effects of improving a switching property due to lowering off-current, suppressing generation of hot carriers, and the like. For the above reasons, the structure with an LDD region is preferable.

The gate electrode 400 is formed over the channel formation region 203 with the gate insulating film 300 interposed therebetween.

The sidewall 501 is formed over the LDD region 204 with the gate insulating film 300 interposed therebetween. The sidewall 502 is formed over the LDD region 205 with the gate insulating film 300 interposed therebetween.

Although the gate insulating film is sandwiched between the LDD regions and the sidewalls in this embodiment mode, a structure in which a gate insulating film is not sandwiched between the LDD regions and the sidewalls may be employed.

Therefore, it is preferable that the sidewalls overlap with the LDD regions. Placing the sidewalls overlapping with the LDD regions allows forming the LDD regions in a self-aligned manner, so that the number of masks for use can be reduced and variations in LDD lengths can be reduced.

A structure without sidewalls can also be employed because the LDD regions can be made using a mask. As described above, however, the structure with the sidewalls is preferable.

The sidewalls are formed by etching back in which the semiconductor layer 200 is used as an etching stopper.

The upper electrode 801 is formed on the top surface of the source region 201.

The upper electrode 802 is formed on the top surface of the drain region 202.

Although the upper electrode may be formed only on the top surface of the high-concentration impurity region (the source region 201 or the drain region 202), it is preferable to form the upper electrode so as to extend to a position where the upper electrode does not overlap with the semiconductor layer.

In particular, it is preferable to form the upper electrode on the top surface of the entire upper surface of the high-concentration impurity region, for the upper electrode and the high-concentration impurity region can have a larger contact area. Further, when the upper electrode is formed so as to cover (so as to be in contact with the entire upper surface and a side surface of) the high-concentration impurity region, the upper electrode is also in contact with the side surface of the high-concentration impurity region, so that the contact area can be increased.

By covering the entire high-concentration impurity regions with the upper electrode, the gate electrode 400, the sidewalls 501 and 502, and the upper electrodes 801 and 802 are formed over the semiconductor layer 200.

Accordingly, the upper surface of the semiconductor layer 200 is not exposed in etching for forming the upper electrode; thus, the semiconductor layer 200 can be prevented from being thinned and being removed entirely due to overetching in etching the upper electrode.

In the case where the semiconductor layer 200 is thinned, the semiconductor layer 200 has higher sheet resistance, so that a current value of a TFT in an on state decreases; consequently, the TFT consumes more electric power.

In the case where the semiconductor layer 200 is removed entirely, the impurity regions and the channel formation region are disconnected physically; consequently, the TFT does not operate.

The interlayer insulating film 600 is formed over the insulator 100, the semiconductor layer 200, the gate insulating film 300, the gate electrode 400, the sidewalls 501 and 502, and the upper electrodes 801 and 802.

In this embodiment mode, the interlayer insulating film 600 is formed so as to cover the semiconductor layer 200, the gate insulating film 300, the gate electrode 400, the sidewalls 501 and 502, and the upper electrodes 801 and 802.

Contact holes pass through the interlayer insulating film 600.

The contact holes overlap with regions where the high-concentration impurity region and the upper electrode are stacked.

In this embodiment mode, the contact hole is formed in a region where the source region 201 and the upper electrode 801 are stacked. Further, the contact hole is also formed overlapping with a region where the drain region 202 and the upper electrode 802 are stacked.

The upper electrodes can be used as etching stoppers by forming the contact holes overlapping with the regions where the high-concentration impurity region and the upper electrode are stacked.

The etching selectivity of the interlayer insulating film with respect to the upper electrodes can be enhanced because a conductive film is used for the upper electrodes.

Accordingly, increase in the sheet resistance of the source region and the drain region, which accompanies thinning of the high-concentration impurity region due to overetching in forming the contact holes, can be prevented.

It is needless to say that contact failure that accompanies entire removal of the high-concentration impurity region due to overetching in forming the contact holes can also be prevented.

It is preferable that the upper electrode have a larger area than that of a bottom portion of the contact hole. The area of the bottom portion of the contact holes is the area of the contact hole (a portion designated by a dashed line 1500 in FIG. 1) formed at a lower portion of the interlayer insulating film 600.

By making the upper electrodes have larger areas than those of the bottom portions of the contact holes, the contact holes can be formed over the upper electrodes reliably even when the contact hole is misplaced. Further, when the upper electrodes are formed so as to cover the high-concentration impurity regions (i.e., so as to be in contact with the entire upper surfaces and the side surfaces), the upper electrodes protrude beyond the high-concentration impurity regions and the upper electrodes have larger areas. Therefore, it is preferable to form the upper electrodes so as to cover the high-concentration impurity regions (i.e., so as to be in contact with the entire upper surfaces and the side surfaces), which functions as a measure against a defect when the contact hole is misplaced. Further, the upper electrodes and the high-concentration impurity regions can have larger contact areas because the upper electrodes have larger areas.

Misplacement of a contact hole means that the contact hole is formed shifted from a position of the contact hole in accordance with a mask design due to malfunction of a light exposure apparatus or the like in photolithography or the like. When the contact hole is misplaced, the wiring and the high-concentration impurity region are not connected electrically with each other in some cases. When the wiring and the high-concentration impurity region are not connected electrically with each other, a defect that the TFT does not operate occurs.

The contact hole may be formed overlapping with the upper electrode without overlapping with the region where the high-concentration impurity region and the upper electrode are stacked.

However, when the contact hole is formed overlapping with the region where the high-concentration impurity region and the upper electrode are stacked, the TFT can have a smaller area in a plane than that of the above structure.

Further, it is preferable that the TFT have a smaller area in the plane in a semiconductor device including a plurality of TFTs because higher integration is possible.

The wirings 701 and 702 are in contact with (are connected to) the upper electrodes 801 and 802, respectively, in the contact holes.

The structure described above can increase a contact area between an electrode and a semiconductor layer.

Embodiment Mode 2

Semiconductor devices of this embodiment mode are described with reference to FIGS. 2 and 3.

Figure 2:
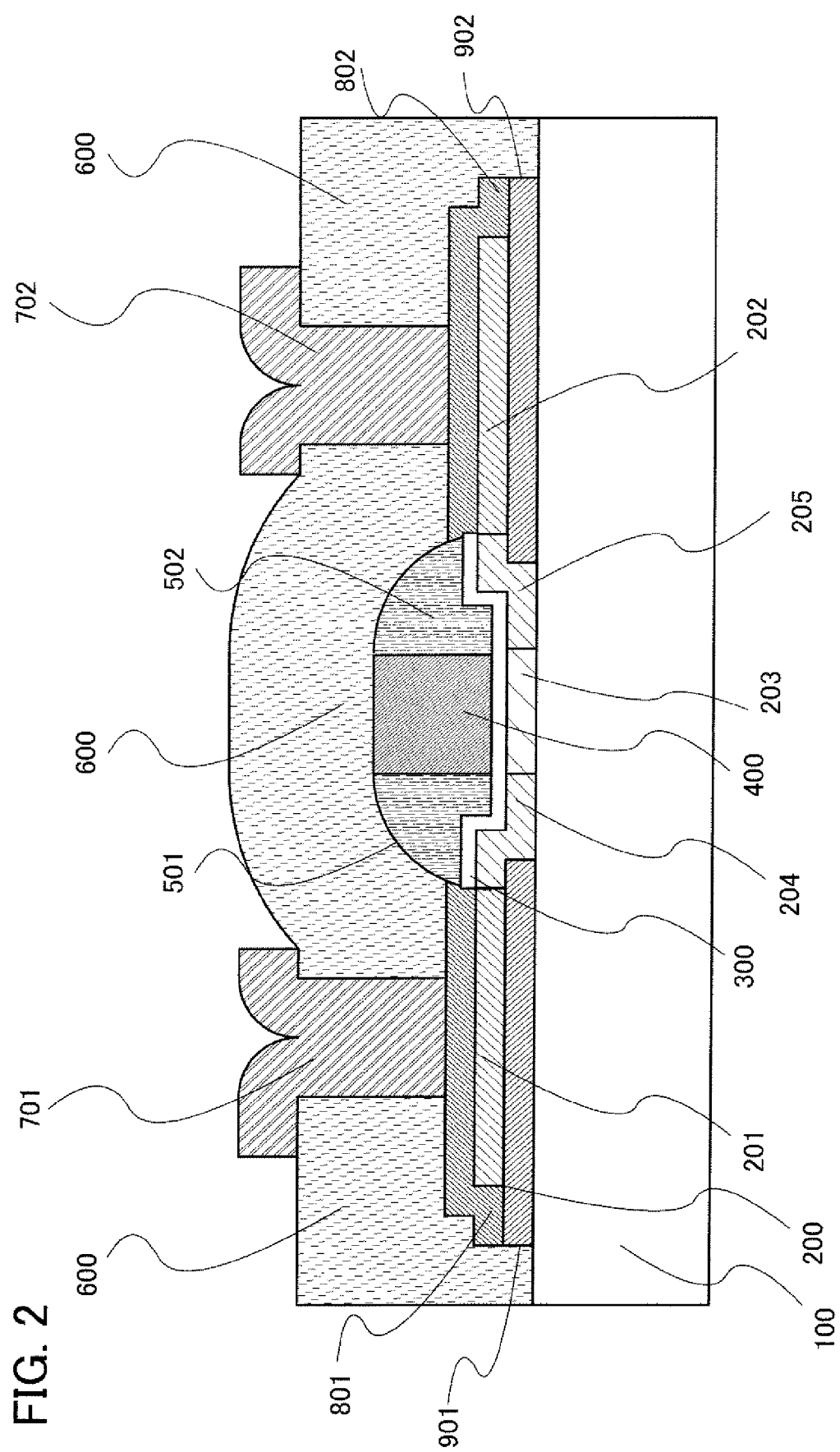
FIG. 2 is a cross-sectional view of a semiconductor device of an embodiment mode of the present invention.
Figure 3:
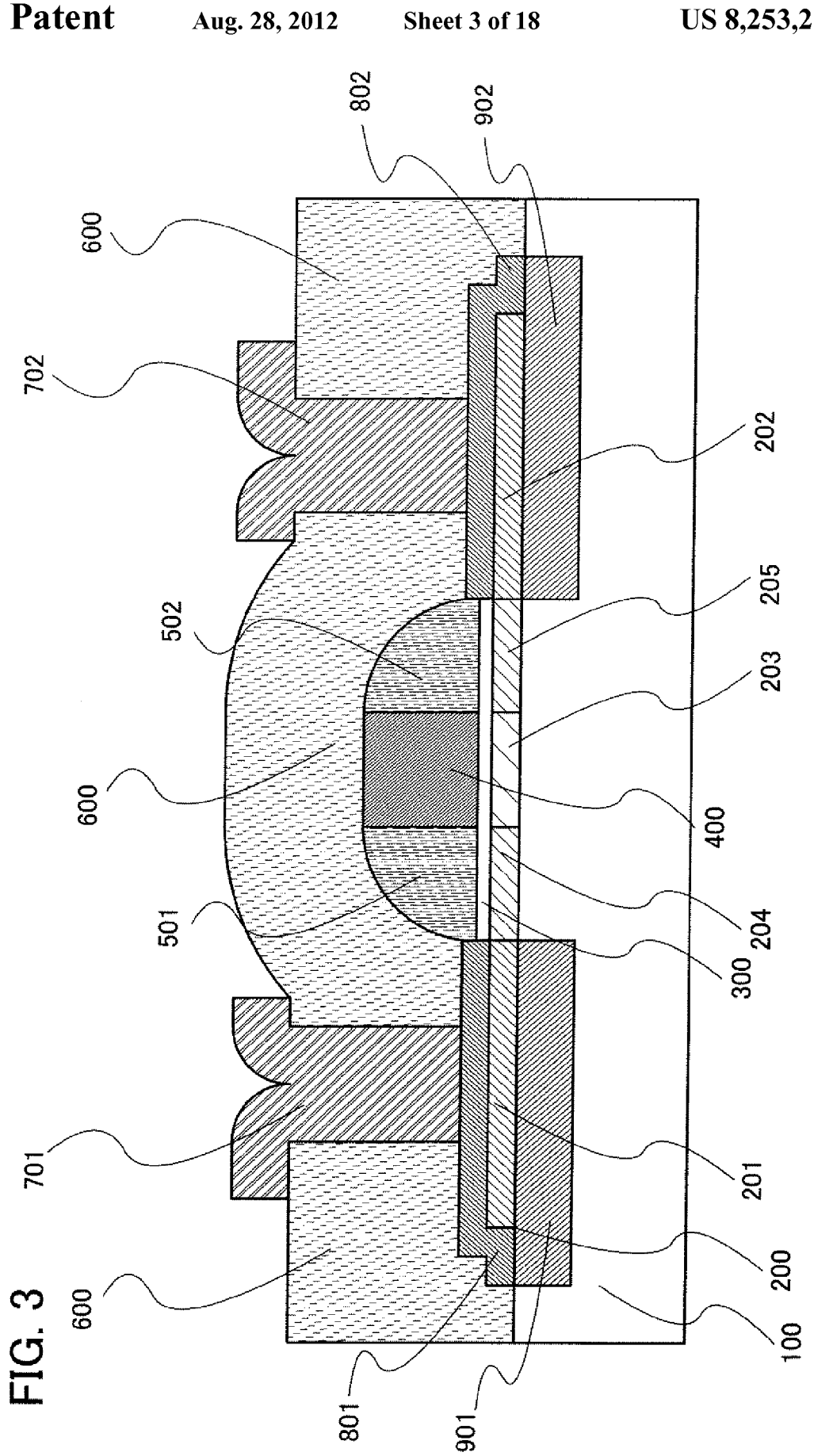
FIG. 3 is a cross-sectional view of a semiconductor device of an embodiment mode of the present invention.

The semiconductor device of this embodiment mode includes an insulator 100, a semiconductor layer 200 (of an island shape), a gate insulating film 300, a gate electrode 400, a sidewall 501, a sidewall 502, an interlayer insulating film 600, a wiring 701, a wiring 702, an upper electrode 801, an upper electrode 802, a lower electrode 901, and a lower electrode 902 (see FIGS. 2 and 3).

In the semiconductor device in FIG. 2, the lower electrodes 901 and 902 are formed over the insulator 100.

The semiconductor device in FIG. 3 has a structure in which opening portions are provided for the insulator 100 (an aperture shape) and a structure in which the lower electrodes 901 and 902 are embedded in the opening portions (an embedded shape).

The semiconductor layer 200 is formed over the insulator 100 and the lower electrodes 901 and 902.

The semiconductor layer 200 includes a channel formation region 203 placed between a source region 201 and a drain region 202.

The source region 201 and the drain region 202 are high-concentration impurity regions that are formed by adding an impurity element imparting conductivity to parts of the semiconductor layer 200 at a high concentration. In this embodiment mode, phosphorus, which is an element imparting n-type conductivity, is added as the impurity element so that the high-concentration impurity regions contain phosphorus at a peak concentration of $1\times10^{19}$ to $1\times10^{21}$ $cm^{-3}$.

In FIGS. 2 and 3, an LDD region 204 and an LDD region 205 are placed between the source region 201 and the drain region 202. The channel formation region 203 is placed between the LDD region 204 and the LDD region 205.

The LDD regions 204 and 205 are low-concentration impurity regions that are formed by adding an impurity element imparting conductivity to parts of the semiconductor layer 200 at a low concentration. In this embodiment mode, phosphorus, which is an element imparting n-type conductivity, is added as the impurity element so that the low-concentration impurity regions contain phosphorus at a peak concentration of $1\times10^{16}$ to $1\times10^{18}$ $cm^{-3}$.

The LDD regions 204 and 205 are not necessarily provided. Further, only either the LDD region 204 or 205 may be provided.

When neither the LDD region 204 nor 205 is present, the channel formation region 203 is provided between the source region 201 and the drain region 202.

When only either the LDD region 204 or 205 is present, the channel formation region 203 and the LDD region are provided between the source region 201 and the drain region 202.

The source region 201 and the upper electrode 801 are formed on the top surface of the lower electrode 901. The drain region 202 and the upper electrode 802 are formed on the top surface of the lower electrode 902.

The source region 201 and the lower electrode 901 are formed on the bottom surface of the upper electrode 801. The drain region 202 and the lower electrode 902 are formed on the bottom surface of the upper electrode 802.

Therefore, the upper electrode and the lower electrode extend to a position where the upper and lower electrodes do not overlap with the semiconductor layer (the outside of the semiconductor layer, or a position where the semiconductor layer is not formed).

That is to say, the high-concentration impurity region is sandwiched between the upper electrode and the lower electrode. The upper electrode and the lower electrode are in contact with each other in a position where the upper and lower electrodes do not overlap with the semiconductor layer.

It is preferable that the upper electrode be in contact with the entire upper surface of the high-concentration impurity region. Further, it is preferable that the lower electrode be in contact with the entire lower surface of the high-concentration impurity region. The reason is that the upper and lower electrodes and the high-concentration impurity region can have the largest contact area.

The gate electrode 400 is formed over the channel formation region 203 with the gate insulating film 300 interposed therebetween.

The sidewall 501 is formed over the LDD region 204 with the gate insulating film 300 interposed therebetween. The sidewall 502 is formed over the LDD region 205 with the gate insulating film 300 interposed therebetween.

Although the gate insulating film is sandwiched between the LDD regions and the sidewalls in this embodiment mode, a structure in which a gate insulating film is not sandwiched between the LDD regions and the sidewalls may be employed.

Therefore, it is preferable that the sidewalls overlap with the LDD regions. Placing the sidewalls overlapping with the LDD regions allows forming the LDD regions in a self-aligned manner, so that the number of masks for use can be reduced and variations in LDD lengths can be reduced.

A structure without sidewalls can also be employed because the LDD regions can be made using a mask. As described above, however, the structure with the sidewalls is preferable.

The sidewalls are formed by etching back in which the semiconductor layer 200 is used as an etching stopper.

The interlayer insulating film 600 is formed over the insulator 100, the semiconductor layer 200, the gate insulating film 300, the gate electrode 400, the sidewalls 501 and 502, the upper electrodes 801 and 802, and the lower electrodes 901 and 902.

In this embodiment mode, the interlayer insulating film 600 is formed so as to cover the semiconductor layer 200, the gate insulating film 300, the gate electrode 400, the sidewalls 501 and 502, and the upper electrodes 801 and 802.

Contact holes pass through the interlayer insulating film 600.

The contact holes overlap with regions where the high-concentration impurity region and the upper electrode are stacked.

In this embodiment mode, the contact hole is formed in a region where the source region 201 and the upper electrode 801 are stacked. Further, the contact hole is also formed overlapping with a region where the drain region 202 and the upper electrode 802 are stacked.

The wirings 701 and 702 are in contact with (be connected to) the upper electrodes 801 and 802, respectively, in the contact holes.

The semiconductor device in FIG. 2 has a step due to a thickness of the lower electrode because the lower electrode is formed over the insulator 100.

The step can cause a step disconnection of the semiconductor layer 200. In particular, in the case where the semiconductor layer is thinned in order to improve electric characteristics of the semiconductor device, this problem occurs markedly.

A step disconnection means a phenomenon in which part of a film is broken due to insufficient step coverage with the film in forming the film over an object having a step shape.

As a measure against a step disconnection, there is a method in which the thickness of the lower electrode is reduced. However, this method increases resistance of the lower electrode, so that an effect of providing the lower electrode for the high-concentration impurity region may be impaired.

This problem can be solved by embedding the lower electrodes in the insulator 100 like the semiconductor device in FIG. 3.

The reason is that the thickness of the lower electrode can be adjusted by the depth of the opening provided in the insulator 100, and a step with a height which can cause a step disconnection of the semiconductor layer is not formed even when the lower electrode has a large thickness.

In particular, it is preferable that a surface (upper surface) of the insulator and a surface (upper surface) of the lower electrode are planarized so as to form the same plane. "To be planarized so as to form the same plane" means that planarization is performed to a degree in which the step disconnection can be prevented, by utilizing a planarization technology such as CMP. "A degree in which the step disconnection can be prevented" means that the step may have a height of one second or smaller (preferably, one fourth or smaller) of the thickness of the semiconductor layer.

Embodiment Mode 3

This embodiment mode describes a method for manufacturing the semiconductor device described in Embodiment Mode 1.

Figure 4A:
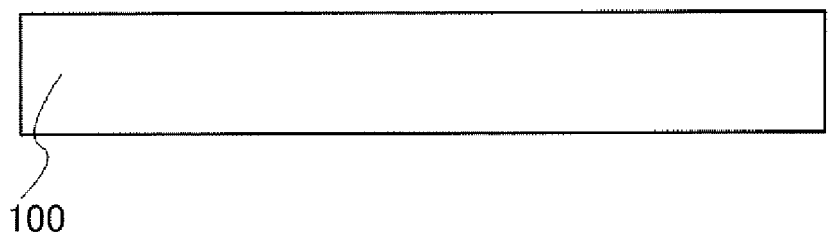
FIGS. 4A to 4C are cross-sectional views showing a method for manufacturing a semiconductor device of an embodiment mode of the present invention.

An insulator 100 is provided The insulator may be an insulating substrate or a base insulating film provided over a substrate (see FIG. 4A).

As the insulating substrate, a glass substrate, a quartz substrate, a resin substrate, or the like can be used.

As the base insulating film, a single film or stacked films of a silicon oxide film, a silicon nitride film, a silicon nitride oxide film, which contains more nitrogen than oxygen, a silicon oxynitride film, which contains more oxygen than nitrogen, a resin film, and the like can be used.

Figure 4B:
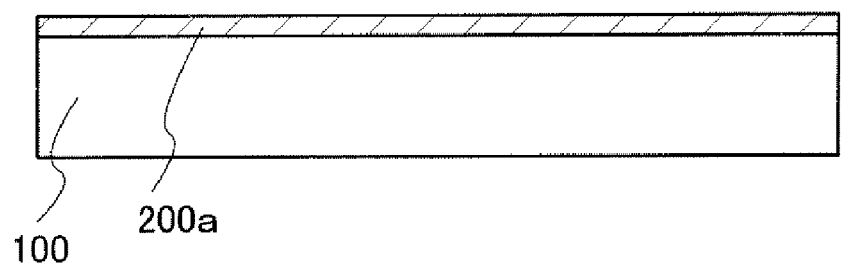

Next, a semiconductor film 200a is formed (see FIG. 4B).

The semiconductor film 200a can be formed using silicon, silicon germanium, or the like by a CVD method, a sputtering method, or the like to have a thickness of 5 to 100 nm.

Next, crystallization is performed by thermal crystallization, laser crystallization, or the like.

Figure 4C:
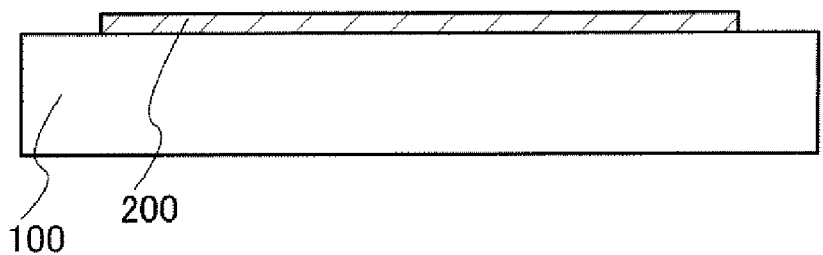

After that, a semiconductor layer 200 is formed by isolating each element (see FIG. 4C).

The elements may be isolated by any method. For example, the semiconductor layer may be formed by etching. Further, the semiconductor layer may be formed by oxidizing or nitriding part of the semiconductor film.

Figure 5A:
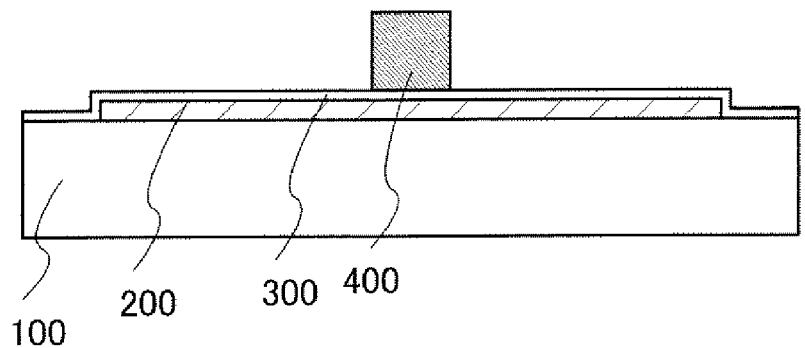
FIGS. 5A to 5C are cross-sectional views showing a method for manufacturing a semiconductor device of an embodiment mode of the present invention.

Next, a gate insulating film 300 is formed over the semiconductor layer 200, and then a gate electrode 400 is formed (see FIG. 5A).

As a material for the gate insulating film 300, a silicon nitride film, a silicon oxide film, a silicon nitride oxide film, which contains more nitrogen than oxygen, a silicon oxynitride film, which contains more oxygen than nitrogen, or the like can be used.

The gate insulating film 300 can be formed by a CVD method, a sputtering method, or the like. The gate insulating film may have a stacked-layer structure. It is preferable that the gate insulating film have a small thickness of 200 nm or smaller. When a channel formation region is thinned, it is preferable that the gate insulating film have a thickness of 50 nm or smaller, more preferably, 20 nm or smaller. A thermal oxidation method, a radical oxidation method, or the like may also be used.

The gate electrode 400 is formed by forming a conductive film and then etching the conductive film.

The conductive film is formed using a conductive film of a single layer or stacked layers of Ti, W, Ta, TaN, Mo, Cr, Cu, Nd, Al, Al—Nd, Al—Si, Al—Ti, or the like by a sputtering method or the like. N-type or p-type silicon may also be used. It is preferable that the conductive film have a thickness of 50 to 500 nm.

Figure 5B:
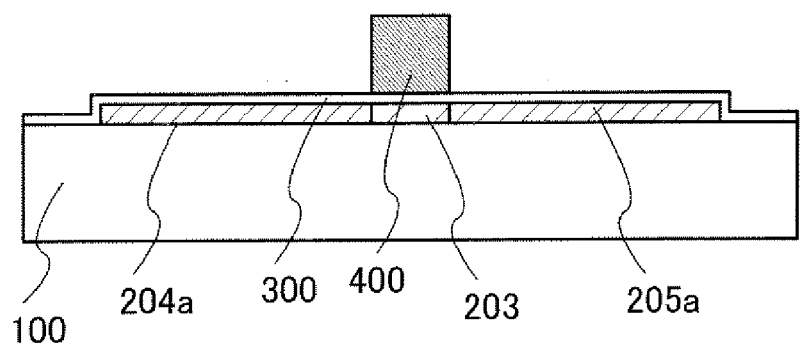

Next, low-concentration impurity regions 204a and 205a are formed in a self-aligned manner by adding an impurity element imparting conductivity using the gate electrode 400 as a mask (see FIG. 5B).

As the impurity element imparting n-type conductivity, phosphorus, arsenic, or the like can be used. As the impurity element imparting p-type conductivity, boron can be used. The impurity element can be added by ion doping, ion implanting, laser doping, a thermal diffusion method, or the like.

Although this embodiment mode describes an example showing only one element for convenience, it is preferable to form a plurality of elements in a plane and form a CMOS circuit in which both an n-channel TFT and a p-channel TFT are formed.

When a CMOS is formed, an n-type impurity element and a p-type impurity element may be added using resist masks in different steps.

Figure 5C:
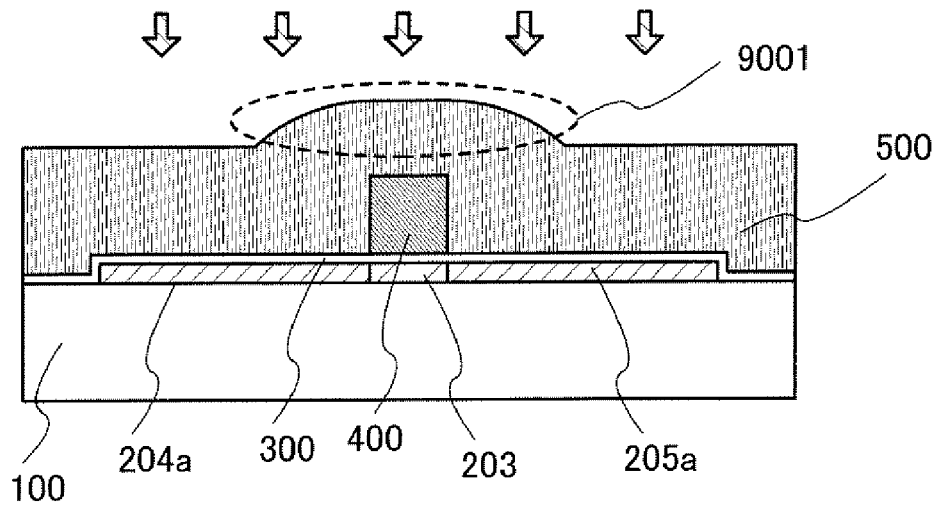

Next, a film 500 for forming sidewalls is formed and etched back (see FIG. 5C).

As the film for forming the sidewalls, when it is an insulating film, a silicon nitride film, a silicon oxide film, a silicon nitride oxide film, which contains more nitrogen than oxygen, a silicon oxynitride film, which contains more oxygen than nitrogen, or the like can be used. It is preferable that the film for forming the sidewalls have a thickness of 100 nm to 1 µm.

When the film 500 for forming the sidewalls is formed, a bump designated by a dashed line 9001 is formed as an influence of a bump of the gate electrode 400 (see FIG. 5C).

Figure 6A:
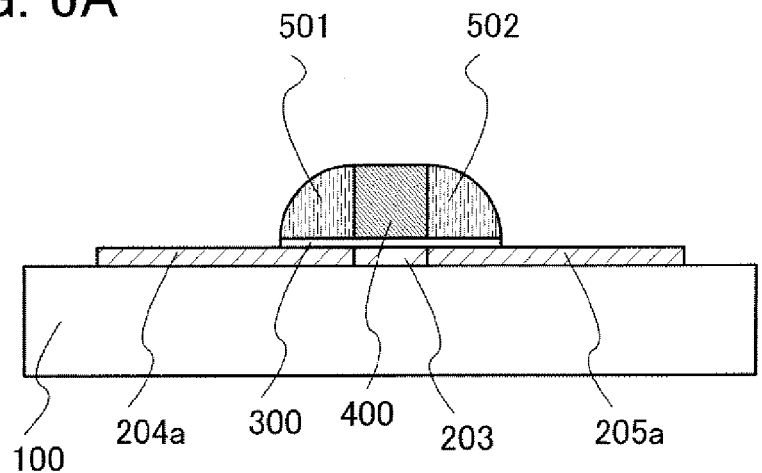
FIGS. 6A to 6C are cross-sectional views showing a method for manufacturing a semiconductor device of an embodiment mode of the present invention.

The film 500 for forming the sidewalls is etched back, so that sidewalls 501 and 502 in contact with the side surfaces of the gate electrode are formed, reflecting the bump shape (see FIG. 6A).

Figure 6B:
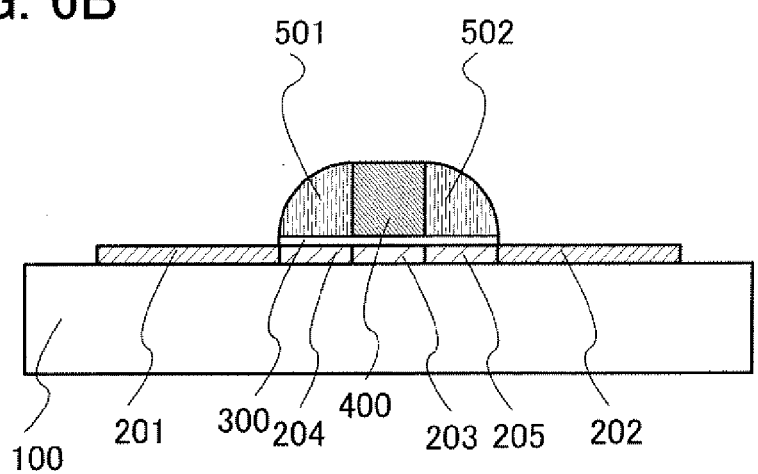

Next, using the gate electrode 400 and the sidewalls 501 and 502 as masks, an impurity element imparting conductivity is added, whereby a source region 201 and a drain region 202 are formed in a self-aligned manner (see FIG. 6B).

At this time, the element imparting the same conductivity type as that of the low-concentration impurity regions is used.

Figure 6C:
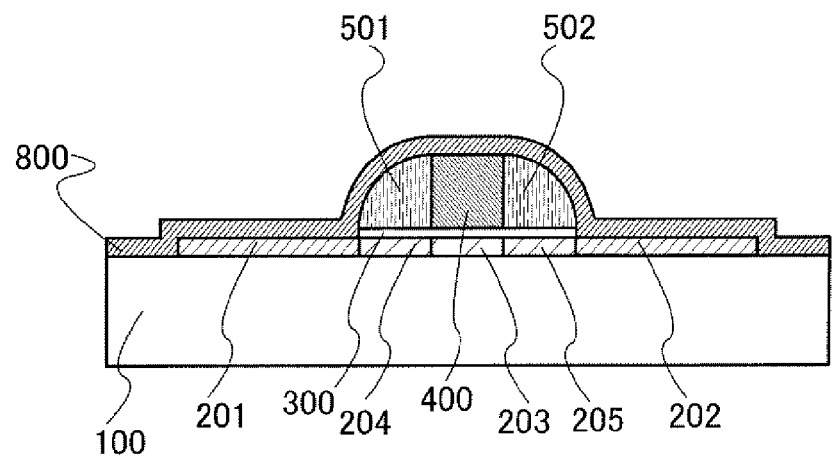

Next, a conductive film 800 for forming upper electrodes is formed. The conductive film 800 for forming the upper electrodes covers the semiconductor layer 200, the gate insulating film 300, the gate electrode 400, and the sidewalls 501 and 502 (see FIG. 6C).

The conductive film 800 for forming the upper electrodes can be formed using Ti, W, Ta, TaN, Mo, Cr, Cu, Cu—Nd, Al, Al—Nd, Al—Si, Al—Ti, Ni, Co, or the like. In particular, it is preferable to use a conductive film with a high melting point, such as W, Ta, TaN, Mo, Cr, or the like because the conductive film of such a material functions as a barrier film against wirings 701 and 702 that are formed later using a low-resistant material (e.g., a material composed mainly of copper, such as Cu or Cu—Nd; or a material composed mainly of aluminum, such as Al, Al—Nd, Al—Si, or Al—Ti).

As described above, Cu, Cu—Nd, Al, Al—Nd, Al—Si, Al—Ti, or the like can be used for the upper electrodes.

However, when such materials are used, the semiconductor layer may be dispersed into the conductive film in heat treatment, so that a reaction in which the semiconductor layer is perforated with a hole occurs in some cases. Then, a reaction in which the conductive material becomes embedded in the hole in a needle shape occurs. The series of reactions is a defect called "alloy spike". It is unfavorable to use Cu, Cu—Nd, Al, Al—Nd, Al—Si, Al—Ti, or the like for the upper electrodes when a process includes a step in which heat treatment is performed later, for the semiconductor device can come to be inoperative due to alloy spike.

For the above reasons, it is preferable to use a conductive film with a high melting point of W, Ta, TaN, Mo, Cr, or the like (hereinafter, referred to as a "barrier metal layer") as the material of the conductive film 800 for forming the upper electrodes.

Figure 16:
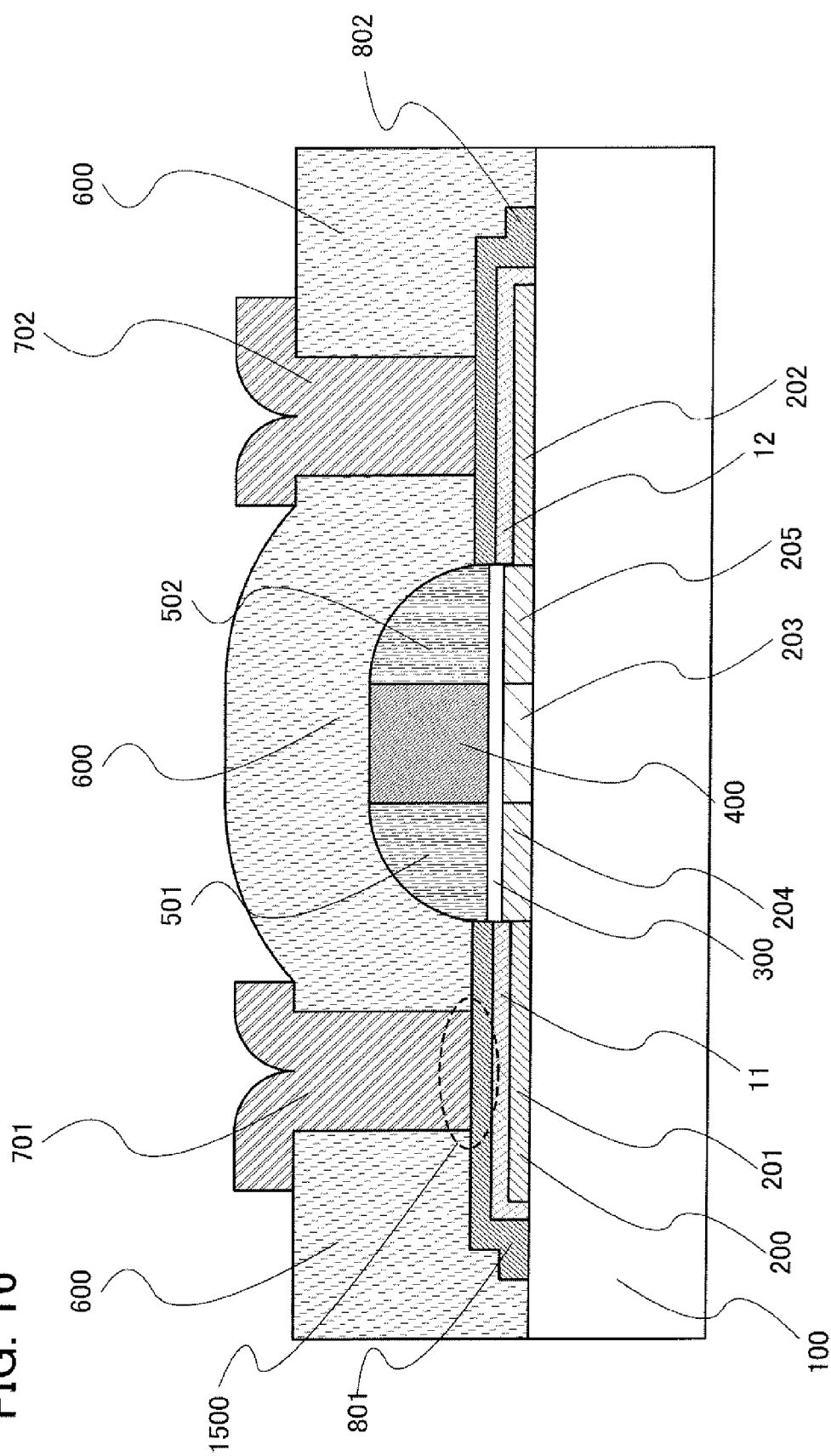
FIG. 16 is a cross-sectional view of a semiconductor device of an embodiment mode of the present invention.

When Ti, Ni, Co, W, Mo, or the like is formed and then heat treatment is performed to make surfaces of the high-concentration impurity regions into silicide, a structure in which the high-concentration impurity region, a silicide layer, and the barrier metal layer (an upper silicide layer 11 and an upper silicide layer 12 in FIG. 16) are stacked in this order is obtained.

The structure in which the silicide layer is formed between the high-concentration impurity region and the barrier metal layer is preferable to a structure in which the high-concentration impurity region and the barrier metal layer are in direct contact with each other because the former has smaller contact resistance.

From the above perspective, it is highly preferable to use Ti, W, or Mo as the material for the conductive film 800 for forming the upper electrodes.

Figure 7A:
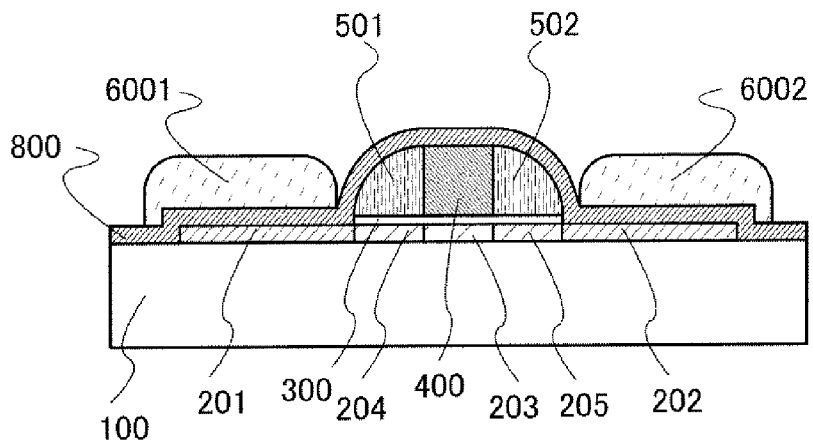
FIGS. 7A to 7C are cross-sectional views showing a method for manufacturing a semiconductor device of an embodiment mode of the present invention.

Next, a resist 6001 and a resist 6002 are formed over the conductive film 800 for forming the upper electrodes (see FIG. 7A).

Figure 7B:
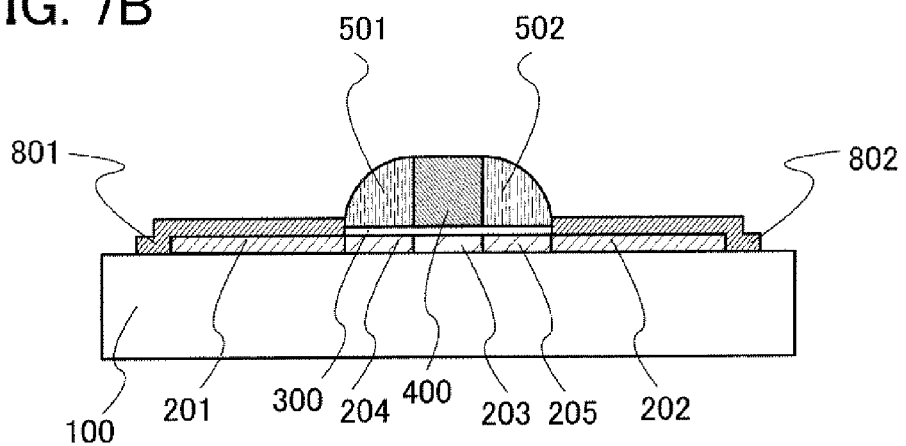

Next, using the resists 6001 and 6002 as masks, the conductive film 800 for forming the upper electrodes over the gate electrode 400 and the sidewalls 501 and 502 is etched, so that an upper electrode 801 on the top surface of the source region 201 and an upper electrode 802 on the top surface of the drain region 202 are formed. After that, the resists 6001 and 6002 are removed (see FIG. 7B).

Figure 7C:
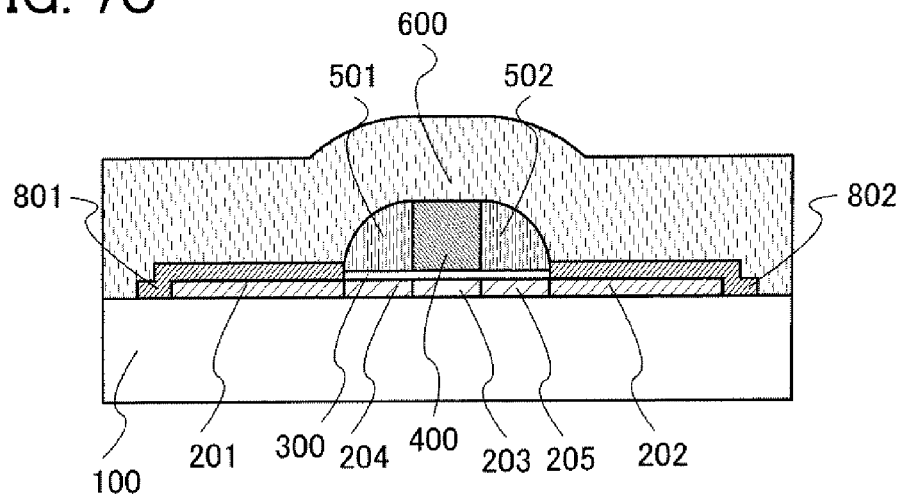

Next, an interlayer insulating film 600 is formed over the insulator 100, the semiconductor layer 200, the gate insulating film 300, the gate electrode 400, the sidewalls 501 and 502, and the upper electrodes 801 and 802 (see FIG. 7C).

The interlayer insulating film 600 can be formed using a silicon nitride film, a silicon oxide film, a silicon nitride oxide film, which contains more nitrogen than oxygen, a silicon oxynitride film, which contains more oxygen than nitrogen, or the like. An organic resin film of acrylic, polyimide, siloxane polymer, or the like can also be used. The interlayer insulating film may have a single-layer or stacked-layer structure. It is preferable that the interlayer insulating film have a larger thickness than that of the gate electrode 400.

In addition, heat treatment may be performed for activating the impurity element before and after forming the interlayer insulating film 600. When Ti, Ni, Co, or the like is used for the upper electrode, silicide is formed by this heat treatment.

Figure 8A:
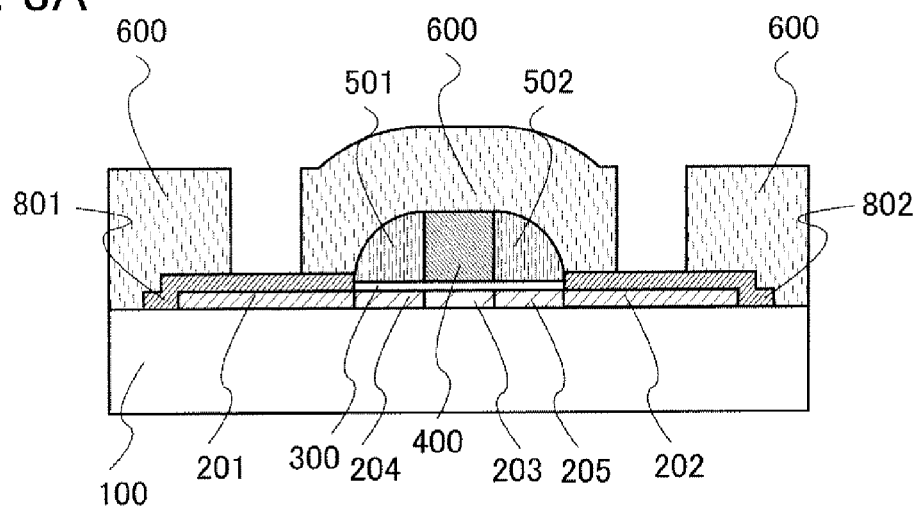
FIGS. 8A to 8C are cross-sectional views showing a method for manufacturing a semiconductor device of an embodiment mode of the present invention.

Next, contact holes are formed through the interlayer insulating film so as to overlap with the upper electrodes (see FIG. 8A).

Figure 8B:
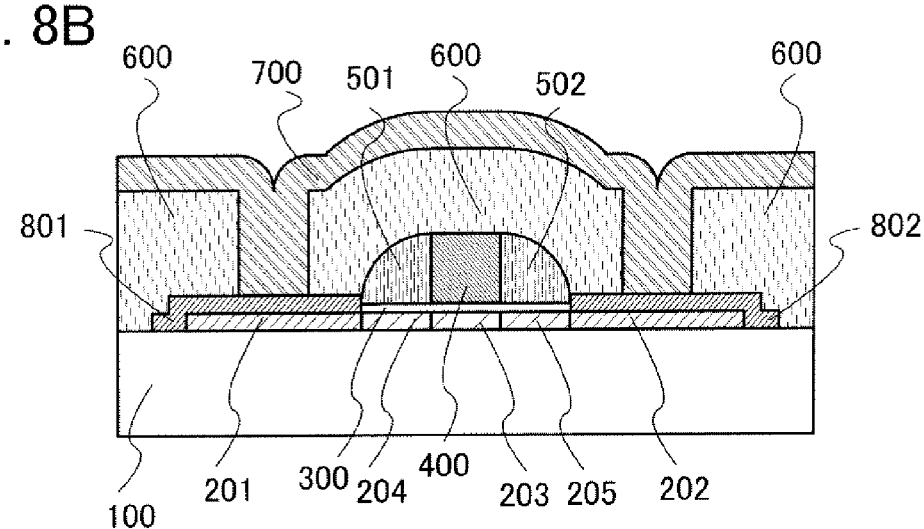

Next, a conductive film 700 is formed over the interlayer insulating film 600 and in the contact holes (see FIG. 8B).

The conductive film 700 is formed using a conductive film of a single layer or stacked layers of Mo, Cr, Cu, Cu—Nd, Nd, Al, Al—Nd, Al—Si, Al—Ti, or the like. It is preferable that the conductive film 700 have a thickness of 100 nm to 3 μm.

It is preferable to use a low-resistant material (e.g., a material composed mainly of copper, such as Cu or Cu—Nd; or a material composed mainly of aluminum, such as Al, Al—Nd, Al—Si, or Al—Ti) for the conductive film 700, which leads to lower wiring resistance and thus favorably contributes to lower power consumption, higher speed operation, and the like.

Figure 8C:
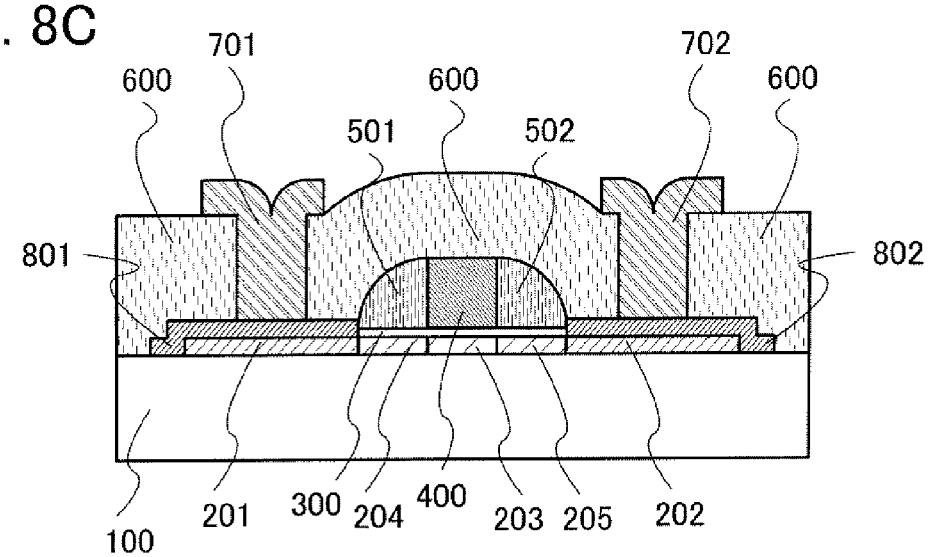

Then, the conductive film 700 is etched, thereby forming wirings 701 and 702 (see FIG. 8C).

After that, a multi-layer wiring, in which a plurality of interlayer insulating films and wirings are stacked, may be formed appropriately in accordance with the design of the circuit.

Embodiment Mode 4

This embodiment mode describes a method for manufacturing the semiconductor device described in Embodiment Mode 2.

Figure 9A:
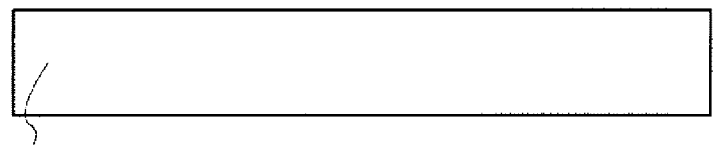
FIGS. 9A to 9F are cross-sectional views showing a method for manufacturing a semiconductor device of an embodiment mode of the present invention.

First, an insulator 100 is provided (see FIG. 9A).

Next, a lower electrode 901 and a lower electrode 902 are formed overlapping with regions which become high-concentration impurity regions.

In the semiconductor device in FIG. 2, the lower electrodes are formed by forming a conductive film for forming the lower electrodes over the insulator 100 and etching the conductive film for forming the lower electrodes.

Figure 9B:
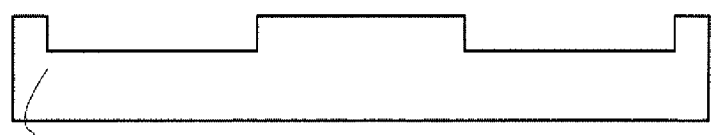

In the semiconductor device in FIG. 3, openings are formed in the insulator 100 (see FIG. 9B).

Figure 9C:
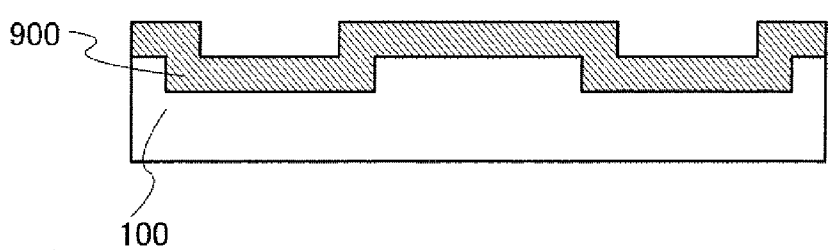

Next, a conductive film 900 for forming the lower electrodes is formed over the insulator 100 (see FIG. 9C).

Figure 9D:
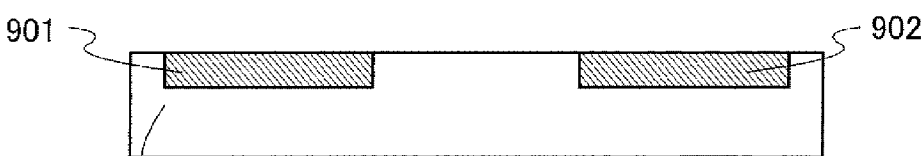

Next, CMP is performed, so that the lower electrodes 901 and 902 embedded in the openings are formed (see FIG. 9D).

The CMP is performed using slurry containing an abrasive such as alumina, silica, or iron nitrate, and a solution of hydrogen peroxide solution, periodic acid, or the like.

The conductive film for forming the lower electrodes can be formed using Ti, W, Ta, TaN, Mo, Cr, Cu, Cu—Nd, Al, Al—Nd, Al—Si, Al—Ti, Ni, Co, or the like. In particular, it is preferable to use a conductive film with a high melting point, such as W, Ta, TaN, Mo, Cr, or the like because the conductive film of such a material functions as a barrier film against wirings 701 and 702 that are formed later and formed of a low-resistant material (e.g., a material composed mainly of copper, such as Cu or Cu—Nd; or a material composed mainly of aluminum, such as Al, Al—Nd, Al—Si, or Al—Ti).

As described above, Cu, Cu—Nd, Al, Al—Nd, Al—Si, Al—Ti, or the like can be used for the lower electrodes.

However, when such materials are used, the semiconductor layer may be dispersed into the conductive film in heat treatment, so that a reaction in which the semiconductor layer is perforated with a hole occurs in some cases. Then, a reaction in which the conductive material becomes embedded in the hole in a needle shape occurs. The series of reactions is a defect called "alloy spike". It is unfavorable to use Cu, Cu—Nd, Al, Al—Nd, Al—Si, Al—Ti, or the like for the lower electrodes when a process includes a step in which heat treatment is performed later, for the semiconductor device can come to be inoperative due to alloy spike.

For the above reasons, it is preferable to use a conductive film with a high melting point of W, Ta, TaN, Mo, Cr, or the like (hereinafter, referred to as a "barrier metal layer") as the material of the conductive film for forming the lower electrodes.

When Ti, Ni, Co, W, Mo, or the like is formed and then heat treatment is performed to make surfaces of the high-concentration impurity regions into silicide, a structure in which the high-concentration impurity region, a silicide layer, and the barrier metal layer (a lower silicide layer 21 and a lower silicide layer 22 in FIGS. 17 and 18) are stacked in this order is obtained.

The structure in which the silicide layer is formed between the high-concentration impurity region and the barrier metal layer is preferable to a structure in which the high-concentration impurity region and the barrier metal layer are in direct contact with each other because the former has smaller contact resistance.

From the above perspective, it is highly preferable to use Ti, W, or Mo as the material for the conductive film 900 for forming the lower electrodes.

Figure 9E:
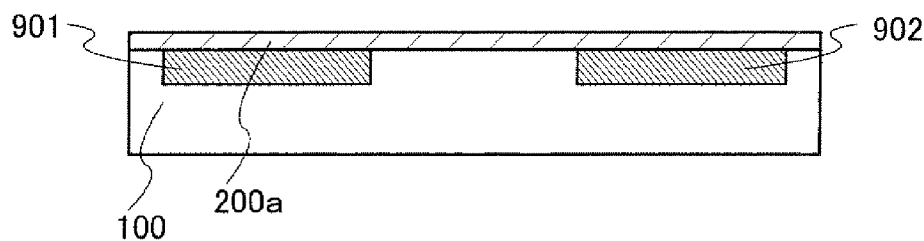

Next, a semiconductor film 200a is formed (see FIG. 9E).

The semiconductor film 200a can be formed using silicon, silicon germanium, or the like by a CVD method, a sputtering method, or the like to have a thickness of 5 to 100 nm.

Next, crystallization is performed by thermal crystallization, laser crystallization, or the like.

Figure 9F:
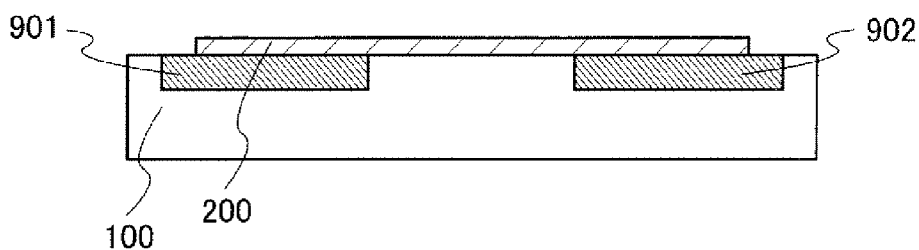

After that, a semiconductor layer 200 is formed by isolating each element (see FIG. 9F).

The elements may be isolated by any method. For example, the semiconductor layer may be formed by etching. Further, the semiconductor layer may be formed by oxidizing or nitriding part of the semiconductor film.

Figure 10A:
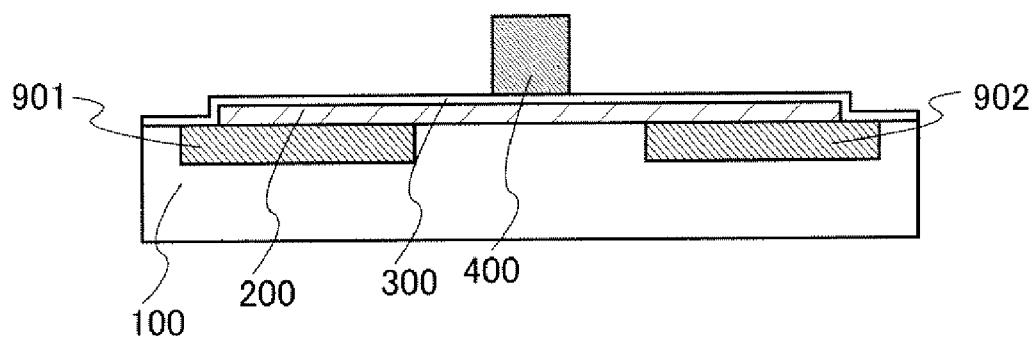
FIGS. 10A to 10C are cross-sectional views showing a method for manufacturing a semiconductor device of an embodiment mode of the present invention.

Next, a gate insulating film 300 is formed over the semiconductor layer 200, and then a gate electrode 400 is formed (see FIG. 10A).

As a material for the gate insulating film 300, a silicon nitride film, a silicon oxide film, a silicon nitride oxide film, which contains more nitrogen than oxygen, a silicon oxynitride film, which contains more oxygen than nitrogen, or the like can be used.

The gate insulating film 300 can be formed by a CVD method, a sputtering method, or the like. The gate insulating film may have a stacked-layer structure. It is preferable that the gate insulating film have a small thickness of 200 nm or smaller. When a channel formation region is thinned, it is preferable that the gate insulating film have a thickness of 50 nm or smaller, more preferably, 20 nm or smaller.

The gate electrode 400 is formed by forming a conductive film and then etching the conductive film.

The conductive is formed using a conductive film of a single layer or stacked layers of Ti, W, Ta, TaN, Mo, Cr, Cu, Nd, Al, Al—Nd, Al—Si, Al—Ti, or the like by a sputtering method or the like. N-type or p-type silicon may also be used. It is preferable that the conductive film have a thickness of 50 to 500 nm.

Figure 10B:
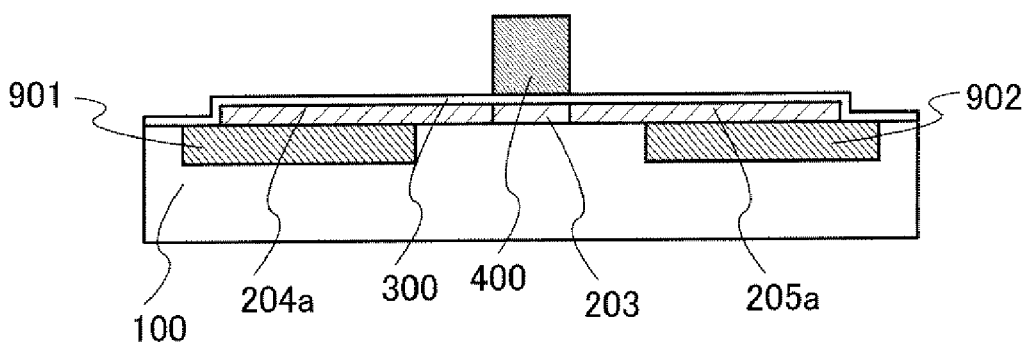

Next, low-concentration impurity regions 204a and 205a are formed in a self-aligned manner by adding an impurity element imparting conductivity using the gate electrode 400 as a mask (see FIG. 10B).

As the impurity element imparting n-type conductivity, phosphorus, arsenic, or the like can be used. As the impurity element imparting p-type conductivity, boron can be used.

The impurity element can be added by ion doping, ion implanting, laser doping, a thermal diffusion method, or the like.

Although this embodiment mode describes an example showing only one element for convenience, it is preferable to form a plurality of elements in a plane and form a CMOS circuit in which both an n-channel TFT and a p-channel TFT are formed.

When a CMOS is formed, an n-type impurity element and a p-type impurity element may be added using resist masks in different steps.

Figure 10C:
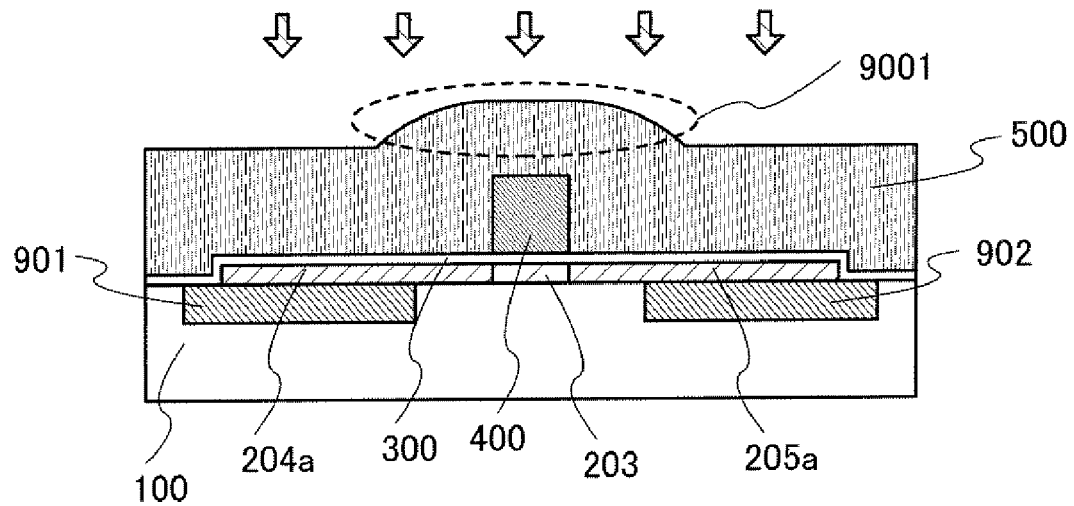

Next, a film 500 for forming sidewalls is formed and etched back (see FIG. 10C).

As the film for forming the sidewalls, when it is an insulating film, a silicon nitride film, a silicon oxide film, a silicon nitride oxide film, which contains more nitrogen than oxygen, a silicon oxynitride film, which contains more oxygen than nitrogen, or the like can be used. It is preferable that the film for forming the sidewalls have a thickness of 100 nm to 1 μm.

When the film 500 for forming the sidewalls is formed, a bump designated by a dashed line 9001 is formed as an influence of a bump of the gate electrode 400 (see FIG. 10C).

Figure 11A:
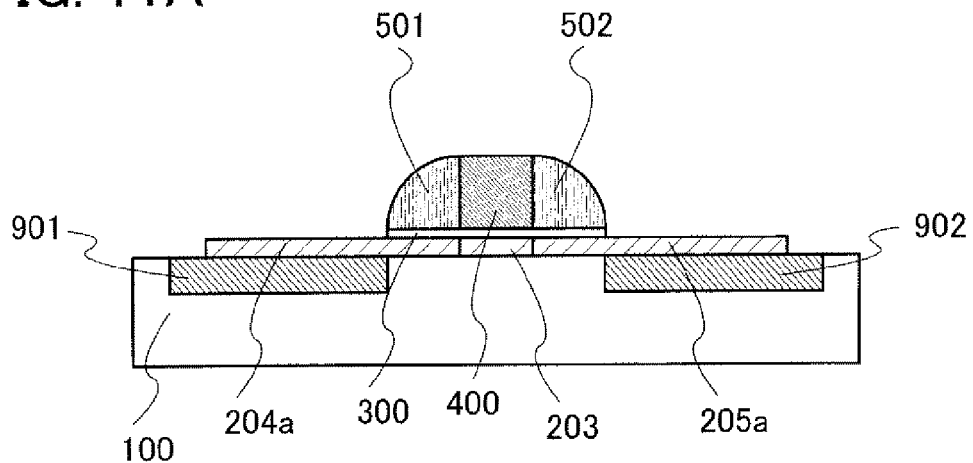
FIGS. 11A to 11C are cross-sectional views showing a method for manufacturing a semiconductor device of an embodiment mode of the present invention.

The film 500 for forming the sidewalls is etched back, so that sidewalls 501 and 502 in contact with the side surfaces of the gate electrode are formed, reflecting the bump shape designated by the dashed line 9001 (see FIG. 11A).

Figure 11B:
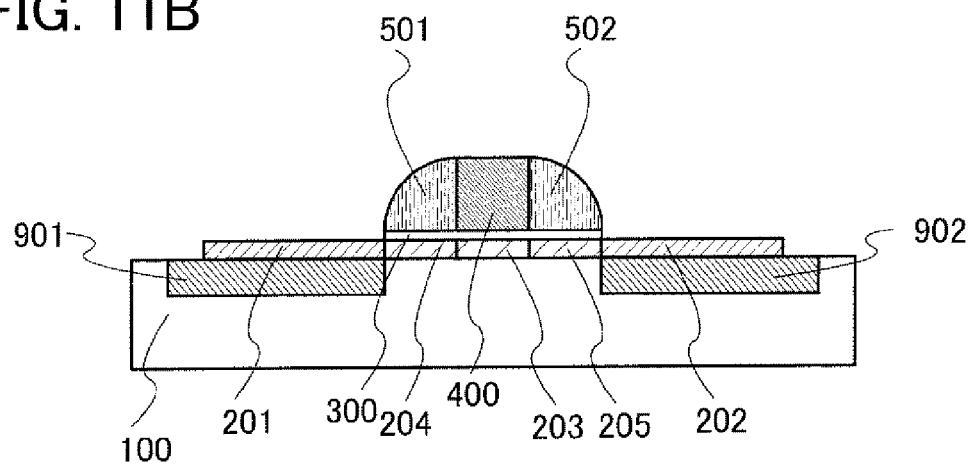

Next, using the gate electrode 400 and the sidewalls 501 and 502 as masks, an impurity element imparting conductivity is added, whereby a source region 201 and a drain region 202 are formed in a self-aligned manner (see FIG. 11B).

At this time, the element imparting the same conductivity type as that of the low-concentration impurity regions is used.

Figure 11C:
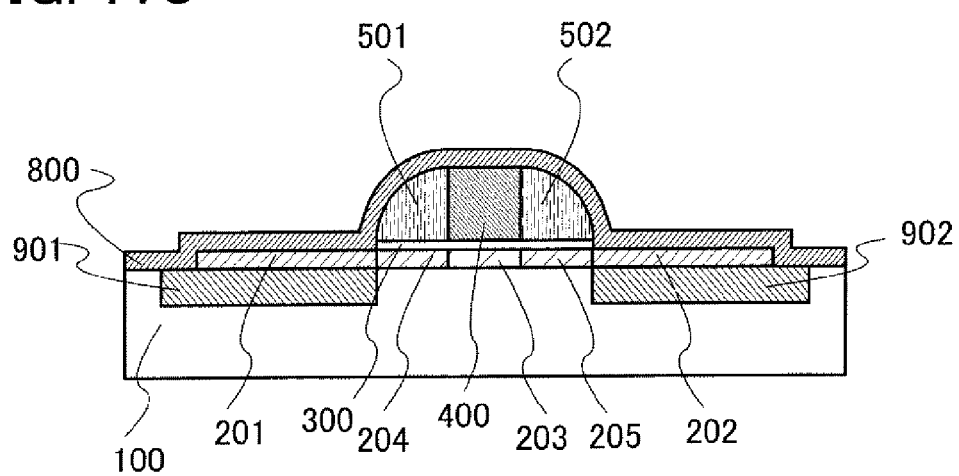

Next, a conductive film 800 for forming upper electrodes is formed. The conductive film 800 for forming the upper electrodes covers the semiconductor layer 200, the gate insulating film 300, the gate electrode 400, and the sidewalls 501 and 502 (see FIG. 11C).

The conductive film 800 for forming the upper electrodes can be formed using Ti, W, Ta, TaN, Mo, Cr, Cu, Cu—Nd, Al, Al—Nd, Al—Si, Al—Ti, Ni, Co, or the like. In particular, it is preferable to use a conductive film with a high melting point, such as W, Ta, TaN, Mo, Cr, or the like because the conductive film of such a material functions as a barrier film against the wirings 701 and 702 that are formed later using a low-resistant material (e.g., a material composed mainly of copper, such as Cu or Cu—Nd; or a material composed mainly of aluminum, such as Al, Al—Nd, Al—Si, or Al—Ti).

As described above, Cu, Cu—Nd, Al, Al—Nd, Al—Si, Al—Ti, or the like can be used for the upper electrodes.

However, when such materials are used, the semiconductor layer may be dispersed into the conductive film in heat treatment, so that a reaction in which the semiconductor layer is perforated with a hole occurs in some cases. Then, a reaction in which the conductive material becomes embedded in the hole in a needle shape occurs. The series of reactions is a defect called "alloy spike". It is unfavorable to use Cu, Cu—Nd, Al, Al—Nd, Al—Si, Al—Ti, or the like for the upper electrodes when a process includes a step in which heat treatment is performed later, for the semiconductor device can come to be inoperative due to alloy spike.

For the above reasons, it is preferable to use a conductive film with a high melting point of W, Ta, TaN, Mo, Cr, or the like (hereinafter, referred to as a "barrier metal layer") as the material of the conductive film 800 for forming the upper electrodes.

Figure 17:
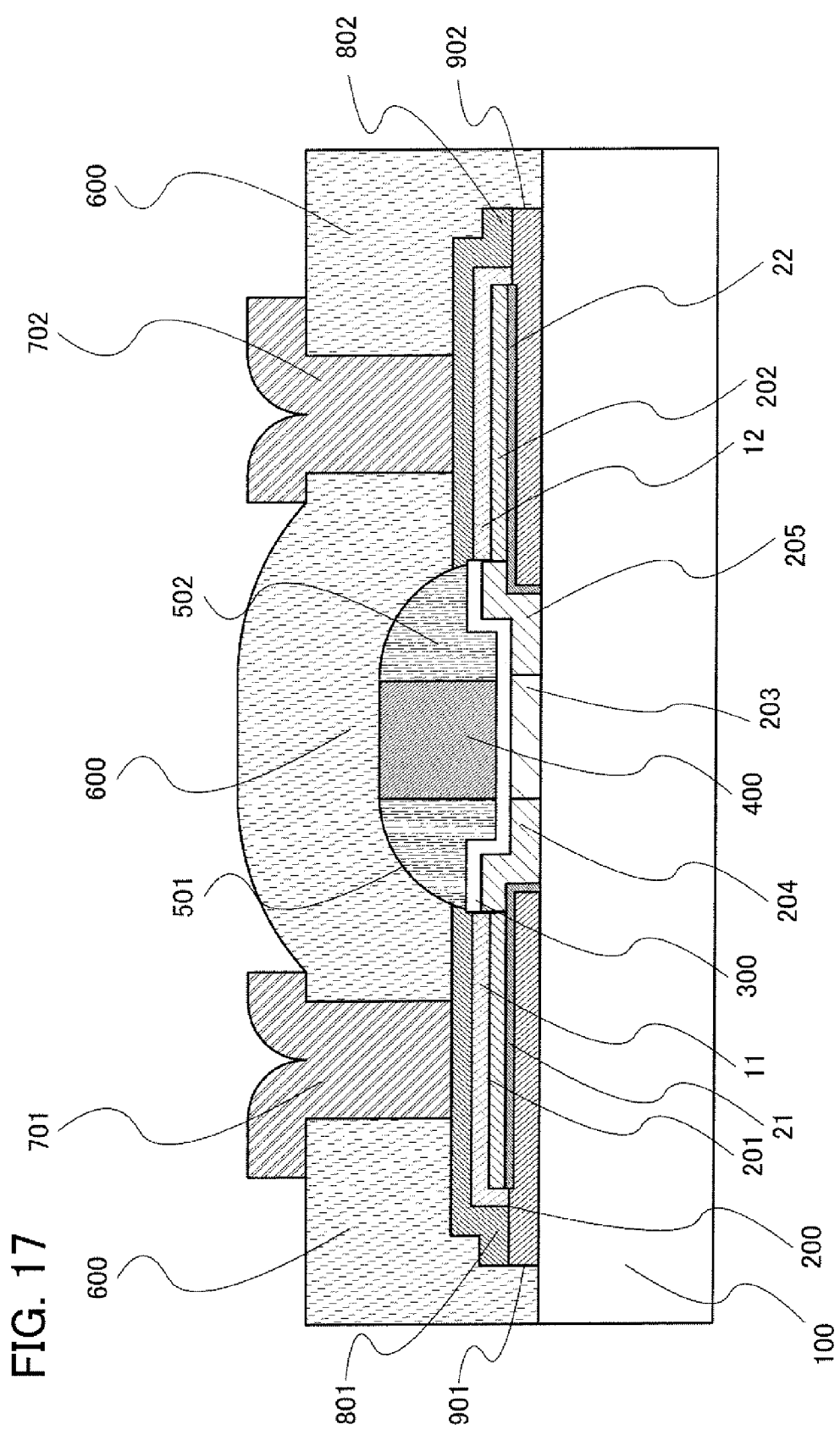
FIG. 17 is a cross-sectional view of a semiconductor device of an embodiment mode of the present invention.

When Ti, Ni, Co, W, Mo, or the like is formed and then heat treatment is performed at a temperature of 500° C. or higher to make surfaces of the high-concentration impurity regions into silicide, a structure in which the high-concentration impurity region, a silicide layer, and the barrier metal layer (an upper silicide layer 11 and an upper silicide layer 12 in FIGS. 17 and 18) are stacked in this order is obtained.

The structure in which the silicide layer is formed between the high-concentration impurity region and the barrier metal layer is preferable to a structure in which the high-concentration impurity region and the barrier metal layer are in direct contact with each other because the former has smaller contact resistance.

From the above perspective, it is highly preferable to use Ti, W, or Mo as the material for the conductive film 800 for forming the upper electrodes.

Figure 12A:
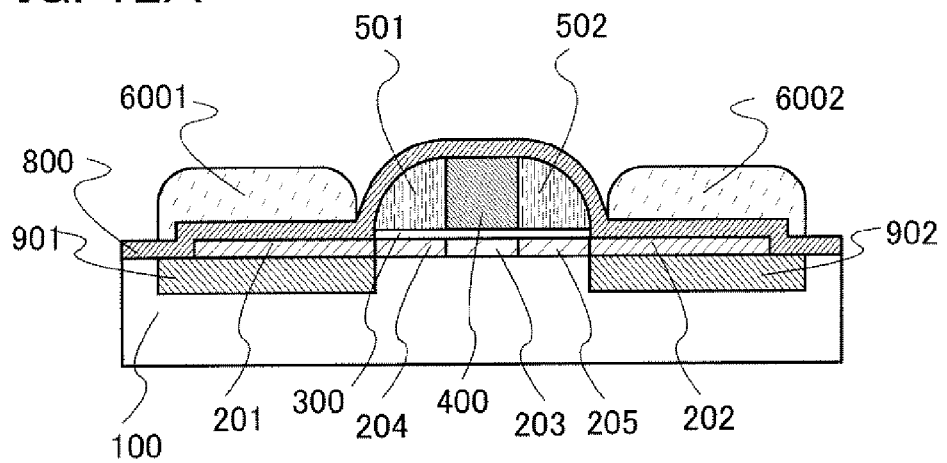
FIGS. 12A to 12C are cross-sectional views showing a method for manufacturing a semiconductor device of an embodiment mode of the present invention.

Next, a resist 6001 and a resist 6002 are formed over the conductive film 800 for forming the upper electrodes (see FIG. 12A).

Figure 12B:
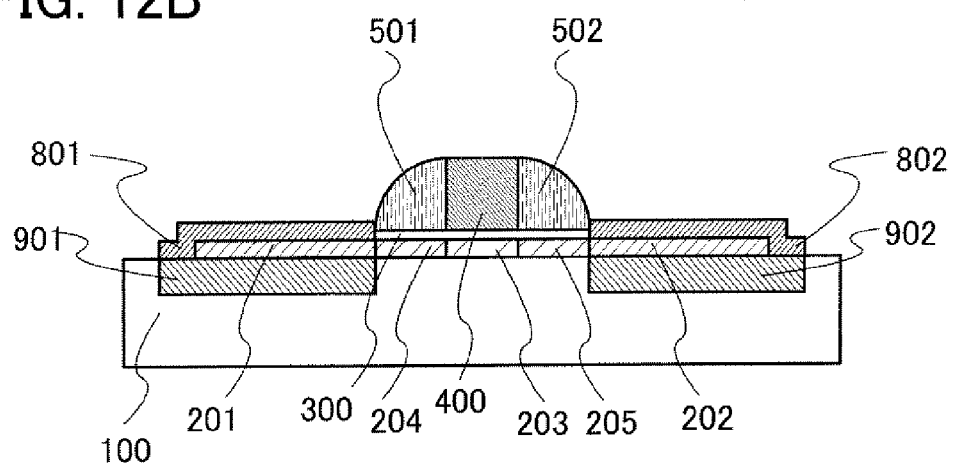

Next, using the resists 6001 and 6002 as masks, the conductive film 800 for forming the upper electrodes over the gate electrode 400 and the sidewalls 501 and 502 is etched, so that an upper electrode 801 on the top surface of the source region 201 and an upper electrode 802 on the top surface of the drain region 202 are formed. After that, the resists 6001 and 6002 are removed (see FIG. 12B).

Figure 12C:
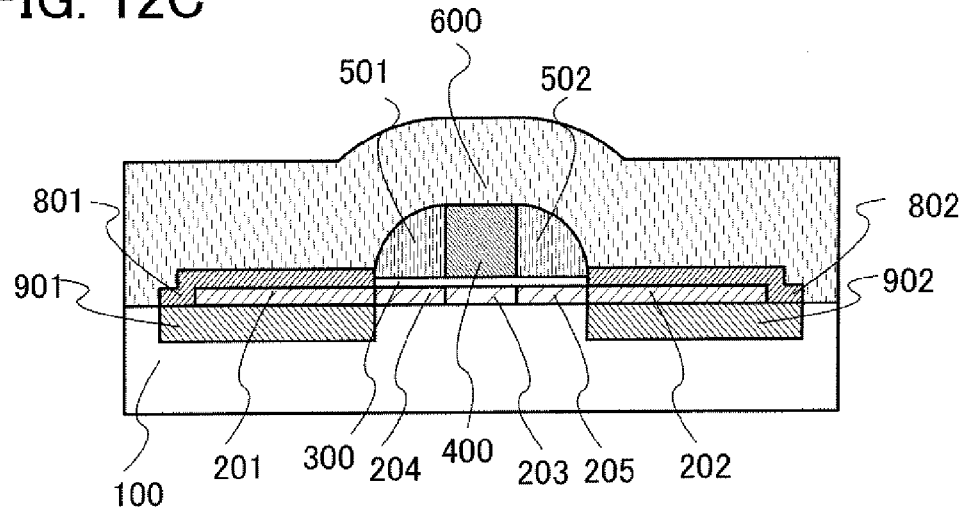

Next, an interlayer insulating film 600 is formed over the insulator 100, the semiconductor layer 200, the gate insulating film 300, the gate electrode 400, the sidewalls 501 and 502, and the upper electrodes 801 and 802 (see FIG. 12C).

The interlayer insulating film 600 can be formed using a silicon nitride film, a silicon oxide film, a silicon nitride oxide film, which contains more nitrogen than oxygen, a silicon oxynitride film, which contains more oxygen than nitrogen, or the like. An organic resin film of acrylic, polyimide, siloxane polymer, or the like can also be used. The interlayer insulating film may have a single-layer or stacked-layer structure. It is preferable that the interlayer insulating film have a larger thickness than that of the gate electrode 400.

In addition, heat treatment may be performed for activating the impurity element before and after forming the interlayer insulating film 600. When Ti, Ni, Co, or the like is used for the upper electrode or the lower electrode (or the both), silicide is formed by this heat treatment.

Figure 13A:
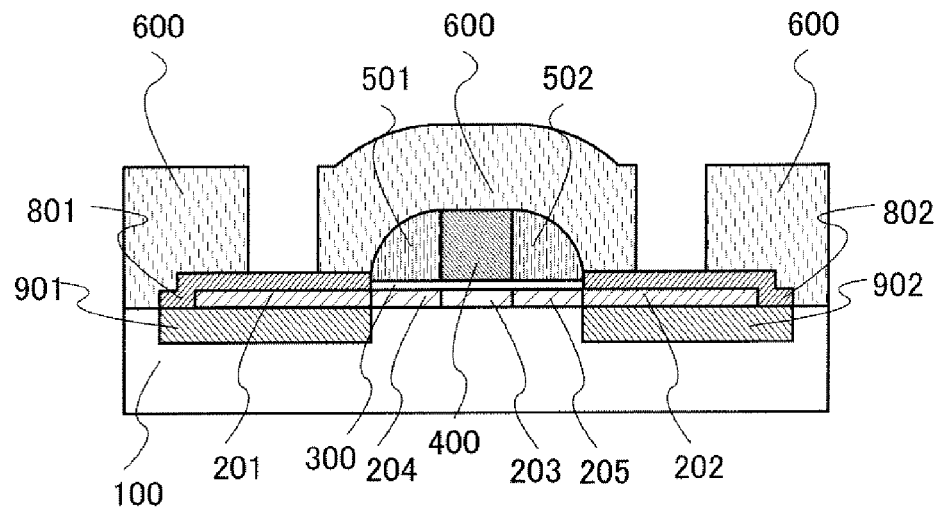
FIGS. 13A to 13C are cross-sectional views showing a method for manufacturing a semiconductor device of an embodiment mode of the present invention.

Next, contact holes are formed through the interlayer insulating film so as to overlap with the upper electrodes (see FIG. 13A).

Figure 13B:
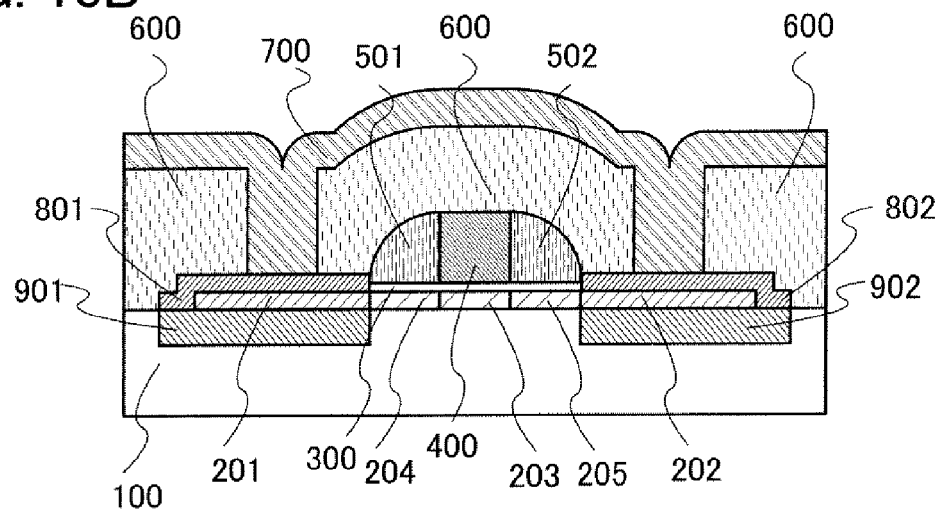

Next, a conductive film 700 is formed over the interlayer insulating film 600 and in the contact holes (see FIG. 13B).

The conductive film 700 is formed using a conductive film of a single layer or stacked layers of Mo, Cr, Cu, Cu—Nd, Nd, Al, Al—Nd, Al—Si, Al—Ti, or the like. It is preferable that the conductive film 700 have a thickness of 100 nm to 3 μm.

It is preferable to use a low-resistant material (e.g., a material composed mainly of copper, such as Cu or Cu—Nd; or a material composed mainly of aluminum, such as Al, Al—Nd, Al—Si, or Al—Ti) for the conductive film 700, which leads to lower wiring resistance and thus favorably contributes to lower power consumption, higher speed operation, and the like.

Figure 13C:
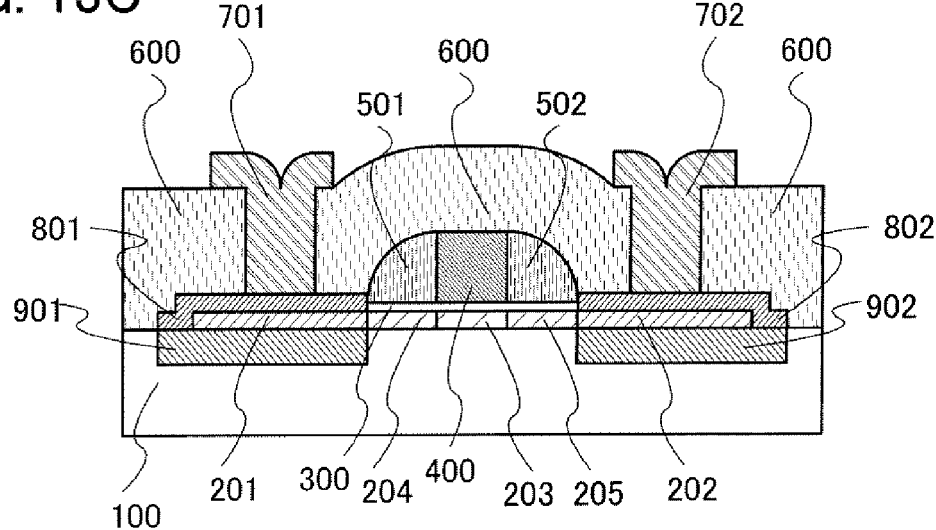

Then, the conductive film 700 is etched, thereby forming the wirings 701 and 702 (see FIG. 13C).

After that, a multi-layer wiring, in which a plurality of interlayer insulating films and wirings are stacked, may be formed appropriately in accordance with the design of the circuit.

Embodiment Mode 5

This embodiment mode describes examples of a semiconductor device of the present invention.

The present invention can be applied to a pixel portion, a drive circuit portion, or the like of a display device provided with an organic light-emitting element, an inorganic light-emitting element, a liquid crystal element, or the like.

Further, the present invention can be applied to an electronic device provided with a memory medium, such as a digital camera, a car navigator, a laptop, a game machine, a personal digital assistant (e.g., a portable telephone or a portable game machine), or a home game machine.

Furthermore, the present invention can be applied to an integrated circuit such as a CPU (a central processing unit).

Figure 14A:
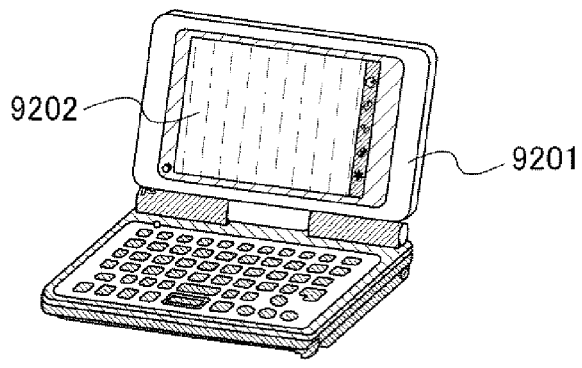
FIGS. 14A to 14E are examples of electronic devices to which the present invention can be applied.
Figure 14B:
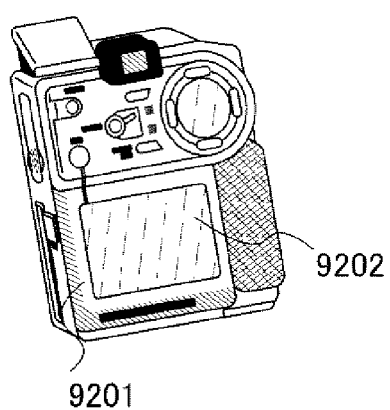
Figure 14C:
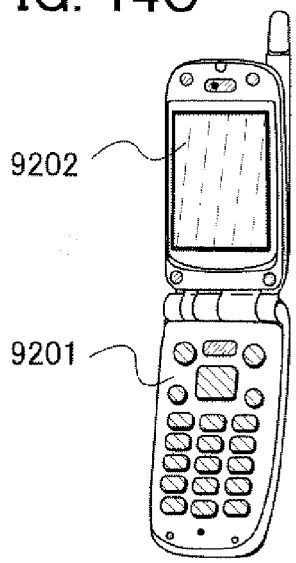
Figure 14D:
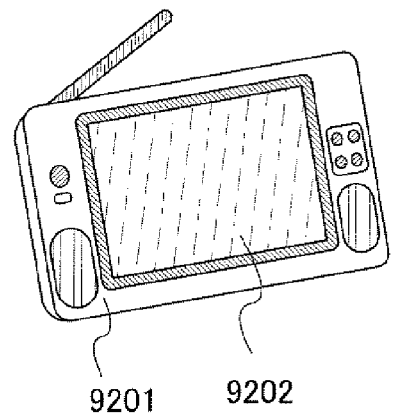
Figure 14E:
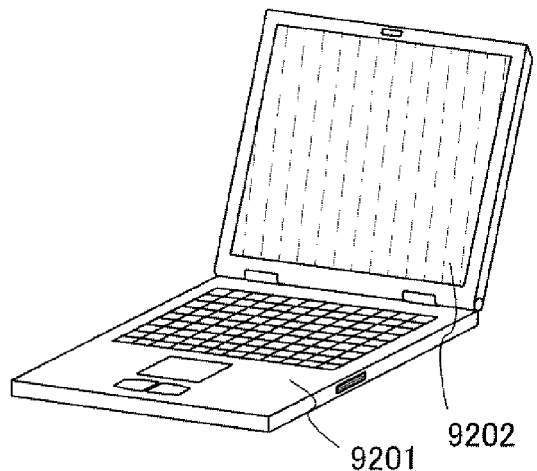
Figure 15A:
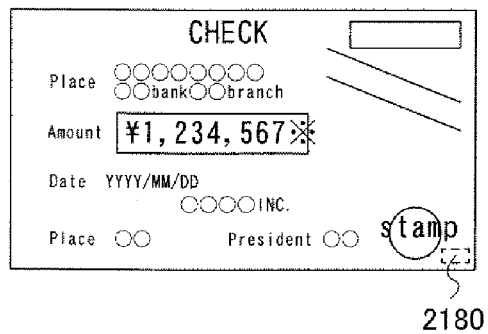
FIGS. 15A to 15H are examples of non-contact tags to which the present invention can be applied.
Figure 15B:
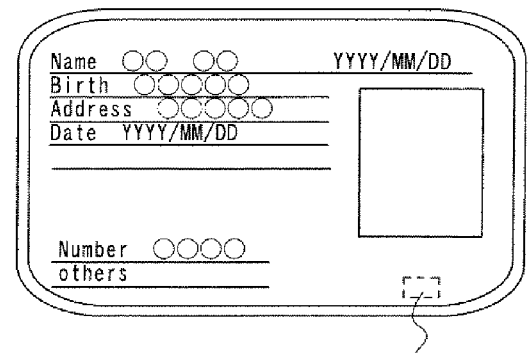
Figure 15C:
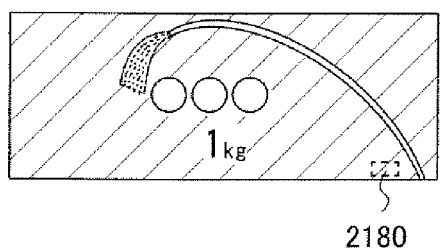
Figure 15D:
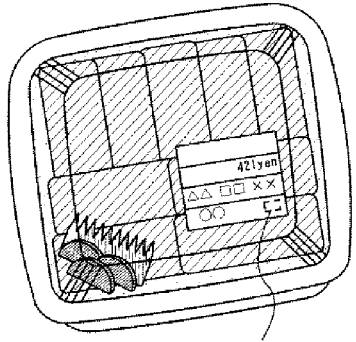
Figure 15E:
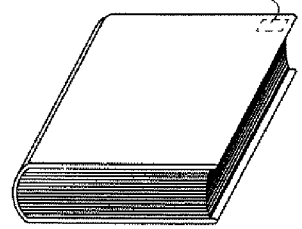
Figure 15F:
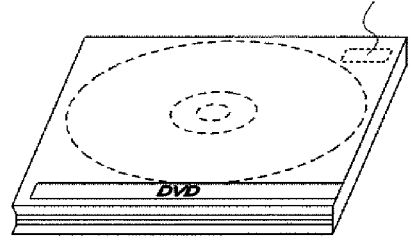
Figure 15G:
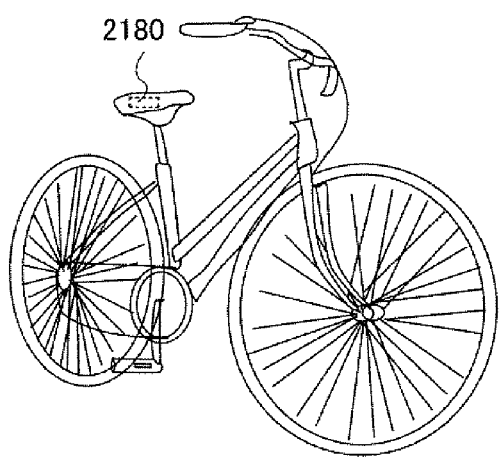
Figure 15H:
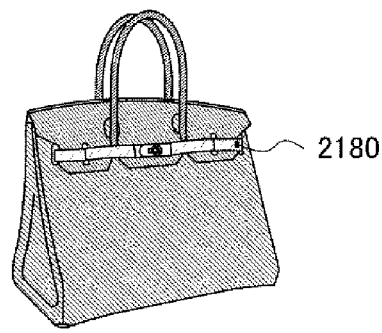

For example, FIG. 14A shows a personal digital assistant. FIG. 14B shows a digital camera. FIG. 14C shows a portable telephone. FIG. 14D shows a car navigator. FIG. 14E shows a laptop. The present invention can be applied to an integrated circuit incorporated in a main body 9201 or a display portion 9202 of these devices.

Furthermore, the present invention can be applied to a semiconductor device which enables non-contact input and output of data. The semiconductor device which enables non-contact input and output of data is called an RFID tag, an ID tag, an IC tag, an IC chip, an RF tag, a wireless tag, an electronic tag, or a wireless chip depending on the usage pattern. These are generically called non-contact tags (non-contact chips).

For example, the present invention can be applied to a non-contact tag 2180 of FIGS. 15A to 15H.

This application is based on Japanese Patent Application serial No. 2007-077624 filed with Japan Patent office on Mar. 23, 2007, the entire contents of which are hereby incorporated by reference.

What is claimed is:

1. A semiconductor device comprising:
   an insulator;
   a semiconductor layer including a channel formation region and an impurity region over the insulator;
   a gate electrode over the channel formation region with a gate insulating film interposed therebetween;
   a silicide layer covering and in contact with the impurity region and a side surface of the semiconductor layer;
   an upper electrode covering the silicide layer;
   an interlayer insulating film covering the semiconductor layer, the gate insulating film, the gate electrode, and the upper electrode;
   a contact hole passing through the interlayer insulating film; and
   a wiring over the interlayer insulating film;
   wherein the contact hole overlaps with the impurity region, the silicide layer and the upper electrode,
   wherein the gate electrode is in contact with the interlayer insulating film, and
   wherein the wiring is in contact with the upper electrode in the contact hole.

2. The semiconductor device according to claim 1, wherein the upper electrode has a larger area than an area of a bottom portion of the contact hole.

3. The semiconductor device according to claim 1, wherein a thickness of the semiconductor layer is 5 nm to 100 nm.

4. The semiconductor device according to claim 1, wherein the insulator is selected from an insulating substrate, a glass substrate, a quartz substrate or a resin substrate.

5. The semiconductor device according to claim 1, wherein the impurity region and the upper electrode are stacked.

6. A method for manufacturing a semiconductor device comprising:
   forming a semiconductor layer including a channel formation region and an impurity region over an insulator;

forming a gate electrode over the channel formation region with a gate insulating film interposed therebetween;

forming a silicide layer to cover and in contact with the impurity region and a side surface of the semiconductor layer;

forming an upper electrode to cover the silicide layer;

forming an interlayer insulating film to cover the semiconductor layer, the gate insulating film, the gate electrode, the silicide layer, and the upper electrode;

forming a contact hole to pass through the interlayer insulating film; and forming a wiring over the interlayer insulating film;

wherein the contact hole overlaps with the impurity region and the upper electrode, wherein the gate electrode is in contact with the interlayer insulating film, and wherein the wiring is in contact with the upper electrode in the contact hole.

7. The method for manufacturing the semiconductor device according to claim 6, wherein the upper electrode has a larger area than an area of a bottom portion of the contact hole.

8. The method for manufacturing the semiconductor device according to claim 6, wherein a thickness of the semiconductor layer is 5 nm to 100 nm.

9. The method for manufacturing the semiconductor device according to claim 6, wherein the semiconductor layer is formed by a CVD method or a sputtering method.

10. The method for manufacturing a semiconductor device according to claim 6, wherein the insulator is selected from an insulating substrate, a glass substrate, a quartz substrate or a resin substrate.

11. The method for manufacturing a semiconductor device according to claim 6, wherein the impurity region and the upper electrode are stacked.

* * * * *